(12) United States Patent
White et al.

(10) Patent No.: US 7,628,899 B2
(45) Date of Patent: Dec. 8, 2009

(54) APPARATUS AND METHOD OF POSITIONING A MULTIZONE MAGNETRON ASSEMBLY

(75) Inventors: John M. White, Hayward, CA (US); Hien-Minh H. Le, San Jose, CA (US); Akihiro Hosokawa, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 773 days.

(21) Appl. No.: 11/301,849

(22) Filed: Dec. 12, 2005

(65) Prior Publication Data

US 2007/0051617 A1    Mar. 8, 2007

Related U.S. Application Data

(63) Continuation-in-part of application No. 11/282,798, filed on Nov. 17, 2005.

(60) Provisional application No. 60/714,979, filed on Sep. 7, 2005.

(51) Int. Cl.
*C25B 9/00* (2006.01)

(52) U.S. Cl. .............. 204/298.17; 204/298.01; 204/298.16; 204/298.2

(58) Field of Classification Search ........... 204/298.01, 204/298.16, 298.17, 298.2
See application file for complete search history.

(56) References Cited

U.S. PATENT DOCUMENTS

| | | | |
|---|---|---|---|
| 3,878,085 A | 4/1975 | Corbant | |
| 4,437,966 A | 3/1984 | Hope et al. | |
| 4,444,643 A | 4/1984 | Garrett | |
| 4,600,492 A | 7/1986 | Ooshio et al. | |
| 4,631,106 A | 12/1986 | Nakazato et al. | |
| 4,714,536 A | 12/1987 | Freeman et al. | |
| 4,717,462 A | 1/1988 | Homma et al. | |
| 4,724,060 A | 2/1988 | Sakata et al. | |
| 4,824,544 A | 4/1989 | Mikalesen et al. | |
| 4,826,584 A | 5/1989 | Ribeiro | |
| 4,995,958 A * | 2/1991 | Anderson et al. | 204/298.2 |
| 5,202,008 A | 4/1993 | Talieh et al. | |

(Continued)

FOREIGN PATENT DOCUMENTS

DE    2707144    2/1977

(Continued)

OTHER PUBLICATIONS

Sloan, Domestic Price List, Jul. 1, 1981, 1-68 pp..

*Primary Examiner*—Alexa D Neckel
*Assistant Examiner*—Michael Band
(74) *Attorney, Agent, or Firm*—Patterson & Sheridan, LLP

(57) ABSTRACT

The present invention generally provides an apparatus and method for processing a surface of a substrate in a PVD chamber that has a magnetron assembly whose shape can be distorted to adjust the magnetic field strength in the processing region of the deposition chamber to improve the deposition uniformity. In general, aspects of the present invention can be used for flat panel display processing, semiconductor processing, solar cell processing, or any other substrate processing. In one aspect, the processing chamber contains one or more magnetron regions and magnetron actuators that are used to increase and more evenly distribute the magnetic field strength throughout the processing region of the processing chamber during processing.

15 Claims, 13 Drawing Sheets

U.S. PATENT DOCUMENTS

| | | | |
|---|---|---|---|
| 5,223,108 A | 6/1993 | Hurwitt |
| 5,242,566 A | 9/1993 | Parker |
| 5,252,194 A | 10/1993 | Demaray et al. |
| 5,314,597 A | 5/1994 | Harra |
| 5,320,728 A | 6/1994 | Tepman |
| 5,328,585 A | 7/1994 | Stevenson et al. |
| 5,362,372 A | 11/1994 | Tepman |
| 5,374,343 A | 12/1994 | Sasaki et al. |
| 5,380,414 A | 1/1995 | Tepman |
| 5,382,344 A | 1/1995 | Hosokawa et al. |
| 5,403,459 A | 4/1995 | Guo |
| 5,419,029 A | 5/1995 | Raaijmakers |
| 5,458,759 A | 10/1995 | Hosokawa et al. |
| 5,505,833 A | 4/1996 | Werner et al. |
| 5,549,802 A | 8/1996 | Guo |
| 5,598,622 A | 2/1997 | Raaijmakers |
| 5,630,917 A | 5/1997 | Guo |
| 5,658,442 A | 8/1997 | Van Gogh et al. |
| 5,707,498 A | 1/1998 | Ngan |
| 5,725,740 A | 3/1998 | Raaijmakers |
| 5,755,936 A | 5/1998 | Raaijmakers |
| 5,780,357 A | 7/1998 | Xu et al. |
| 5,824,197 A | 10/1998 | Tanaka |
| 5,827,408 A | 10/1998 | Raaijmakers |
| 5,833,815 A | 11/1998 | Kim et al. |
| 5,855,744 A | 1/1999 | Halsey et al. |
| 5,873,989 A | 2/1999 | Hughes et al. |
| 5,876,574 A | 3/1999 | Hofmann et al. |
| 5,914,018 A | 6/1999 | Fu et al. |
| 5,956,608 A | 9/1999 | Khurana et al. |
| 6,083,360 A | 7/2000 | Ohlhausen et al. |
| 6,103,069 A | 8/2000 | Davenport |
| 6,143,140 A | 11/2000 | Wang et al. |
| 6,168,696 B1 | 1/2001 | Burton et al. |
| 6,176,978 B1 | 1/2001 | Ngan |
| 6,183,614 B1 | 2/2001 | Fu |
| 6,200,431 B1 | 3/2001 | Sone |
| 6,217,715 B1 | 4/2001 | Sun et al. |
| 6,248,398 B1 | 6/2001 | Talieh et al. |
| 6,251,242 B1 | 6/2001 | Fu et al. |
| 6,271,592 B1 | 8/2001 | Kim et al. |
| 6,287,436 B1 | 9/2001 | Pelletier et al. |
| 6,302,960 B1 | 10/2001 | Baroudi et al. |
| 6,395,146 B2 | 5/2002 | Hieronymi et al. |
| 6,413,383 B1 | 7/2002 | Chiang et al. |
| 6,413,384 B1 | 7/2002 | Wu |
| 6,416,639 B1 | 7/2002 | DeBosscher et al. |
| 6,432,819 B1 | 8/2002 | Pavate et al. |
| 6,436,251 B2 | 8/2002 | Gopalraja et al. |
| 6,436,252 B1 * | 8/2002 | Tzatzov et al. ......... 204/298.22 |
| 6,444,104 B2 | 9/2002 | Gopalraja et al. |
| 6,451,184 B1 | 9/2002 | Sone |
| 6,322,679 B1 | 11/2002 | DeBosscher et al. |
| 6,488,822 B1 | 12/2002 | Moslehi |
| 6,589,407 B1 | 7/2003 | Subramani et al. |
| 6,692,619 B1 | 2/2004 | Chen et al. |
| 6,699,375 B1 | 3/2004 | Crocker |
| 6,709,557 B1 | 3/2004 | Kailasam et al. |
| 6,723,210 B2 | 4/2004 | Teng et al. |
| 6,802,949 B2 | 10/2004 | Hong et al. |
| 6,806,651 B1 | 10/2004 | Chistyakov |
| 6,808,611 B2 | 10/2004 | Sun et al. |
| 6,878,242 B2 | 4/2005 | Wang et al. |
| 2003/0234175 A1 | 12/2003 | Teng |

FOREIGN PATENT DOCUMENTS

| | | |
|---|---|---|
| DE | 19701575 | 7/1998 |
| JP | S53-7586 | 1/1978 |
| JP | 0248876 | 2/1990 |

* cited by examiner

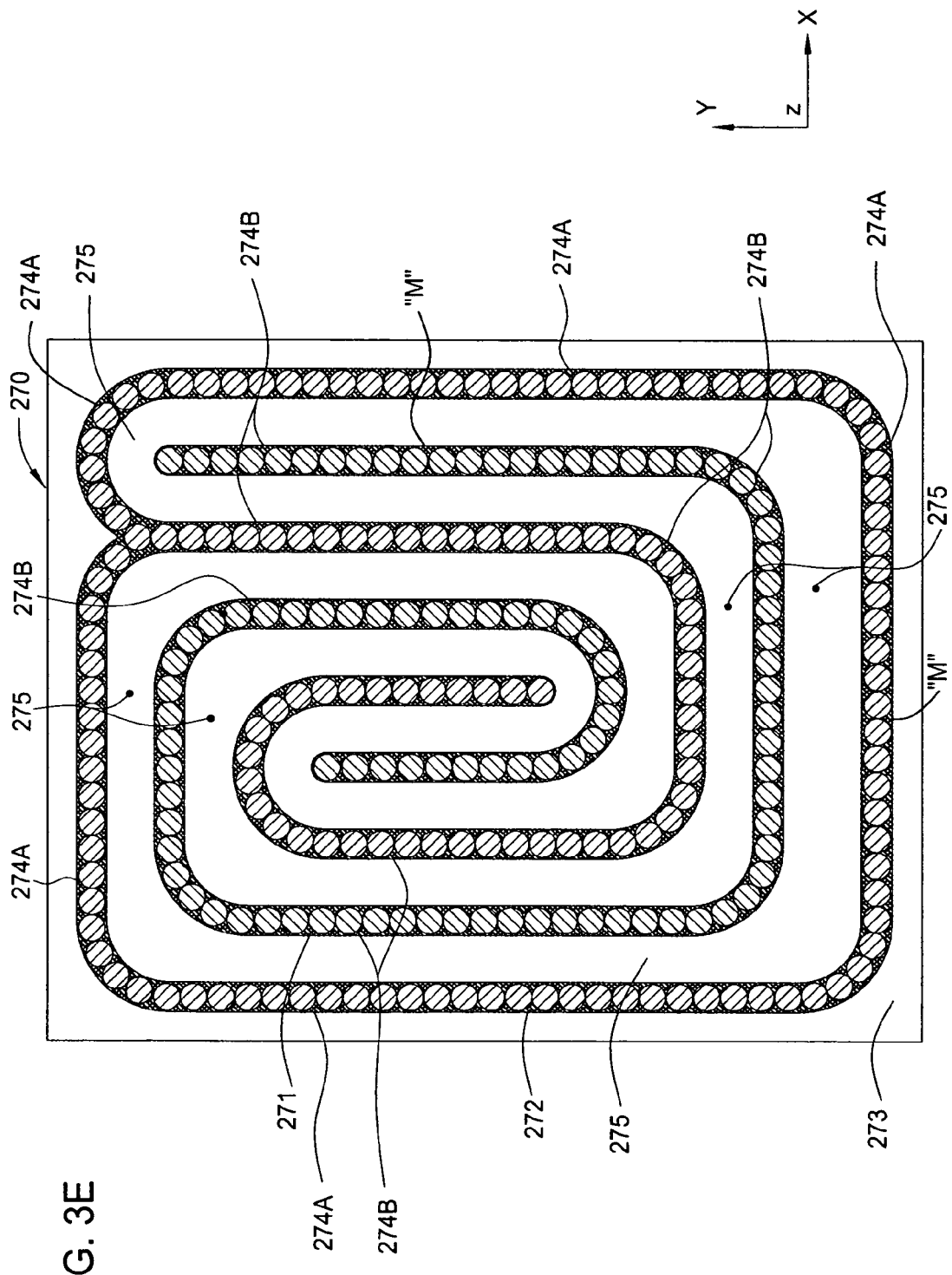

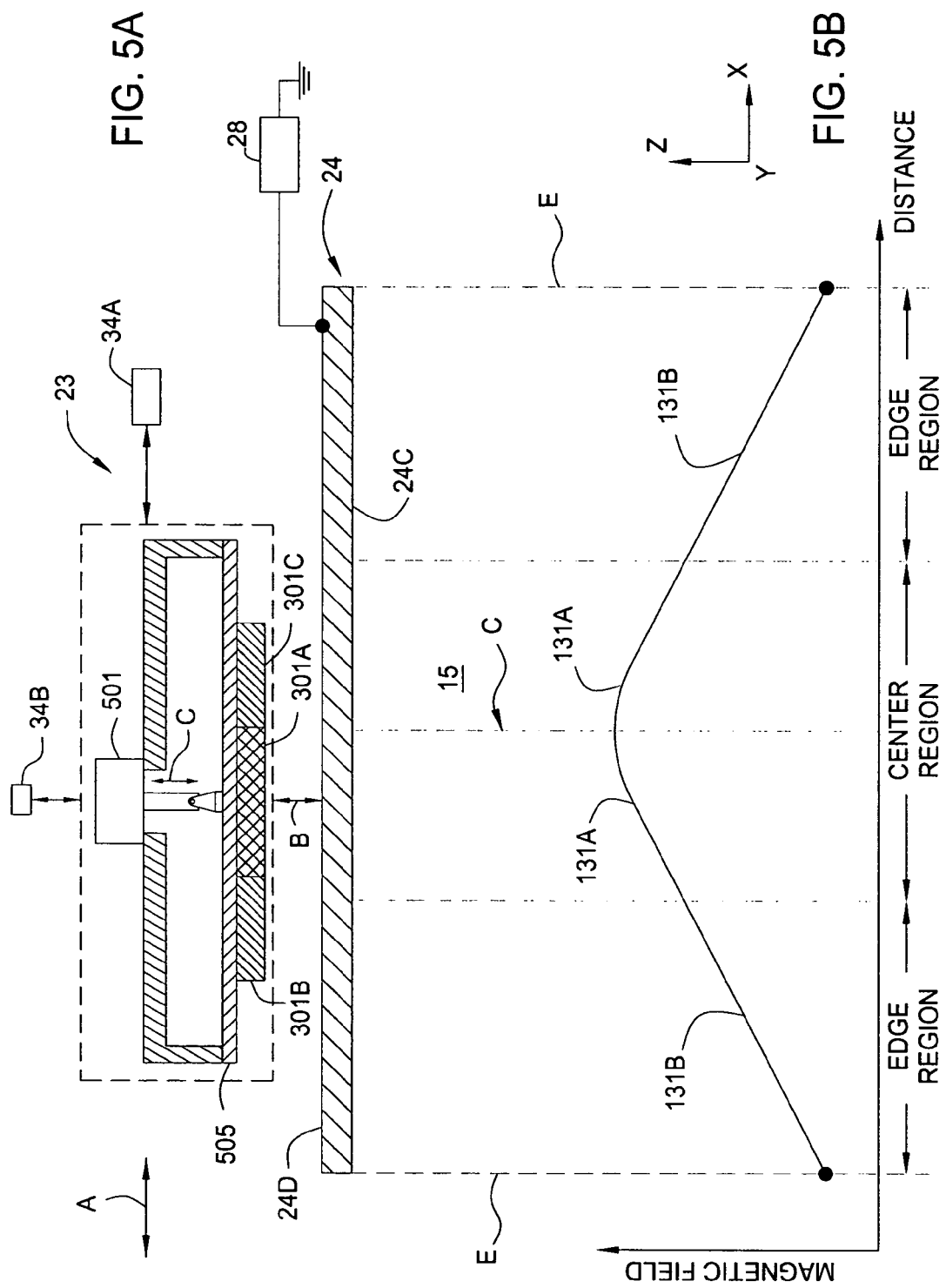

APPARATUS AND METHOD OF POSITIONING A MULTIZONE MAGNETRON ASSEMBLY

CROSS-REFERENCE TO RELATED APPLICATIONS

This application claims benefit of U.S. Provisional Patent Application Ser. No. 60/714,979, filed Sep. 7, 2005 and this application is a continuation-in-part of the of co-pending U.S. patent application Ser. No. 11/282,798, filed Nov. 17, 2005, which are both herein incorporated by reference in their entirety.

BACKGROUND OF THE INVENTION

1. Field of the Invention

Embodiments of the present invention generally relate to substrate plasma processing apparatus and methods adapted to deposit a film on a surface of a substrate.

2. Description of the Related Art

Physical vapor deposition (PVD) using a magnetron is one of the principal methods of depositing metal onto a semiconductor to form electrical connections and other structures in an integrated circuit device. During a PVD process a target is electrically biased so that ions generated in a process region can bombard the target surface with sufficient energy to dislodge atoms from the target. Such a process is commonly called sputtering. The sputtered atoms travel generally toward the wafer and are deposited on the wafer. Alternatively, the atoms react with a gas in the plasma, for example, nitrogen, to reactively deposit a compound on the wafer. Reactive sputtering is often used to form thin barrier and nucleation layers of titanium nitride or tantalum nitride on the substrate.

Direct current (DC) magnetron sputtering is the most usually practiced commercial form of sputtering. The metallic target is biased to a negative DC bias in the range of about −100 to −600 VDC to attract positive ions of the working gas (e.g., argon) toward the target to sputter the metal atoms. Usually, the sides of the sputter chamber are covered with a shield to protect the chamber walls from sputter deposition. The shield is typically electrically grounded and thus provides an anode in opposition to the target cathode to capacitively couple the DC target power to the plasma generated in the sputter chamber.

A magnetron having at least a pair of opposed magnetic poles is typically disposed near the back of the target to generate a magnetic field close to and parallel to the front face of the target. The induced magnetic field from the pair of opposing magnets trap electrons and extend the electron lifetime before they are lost to an anodic surface or recombine with gas atoms in the plasma. Due to the extended lifetime, and the need to maintain charge neutrality in the plasma, additional argon ions are attracted into the region adjacent to the magnetron to form there a high-density plasma. Thereby, the sputtering rate is increased.

However, conventional sputtering presents challenges in the formation of advanced integrated circuits on large area substrates such as flat panel display substrates. Typically, for thin film transistor (TFT) display applications, the substrate is a glass substrate with a surface area greater than about 2000 $cm^2$. Some TFT manufacturers have found that performing PVD processes on substrates greater than about 19,500 $cm^2$ (e.g., 1300 mm×1500 mm) in size tend to have a greater degree of non-uniformity than sizes smaller than 19,500 $cm^2$.

Therefore, there is a need for a method and apparatus that can improve the uniformity of the PVD deposited film.

SUMMARY OF THE INVENTION

The present invention generally provides a plasma processing chamber assembly for depositing a layer on a substrate comprising a plasma processing chamber having a processing region, a target positioned in the plasma processing chamber so that a first surface of the target forms a wall of the processing region, a magnetron assembly positioned facing a second surface, opposite the first surface of the target, wherein the magnetron assembly comprises a flexible plate spaced away from the target, a magnetron region positioned on the flexible plate, wherein the magnetron region has one or more magnets magnetically coupled to the processing region through the target, and a first actuator operably connected to one or more of the magnets to change the shape of the flexible plate and the magnetic field strength in the processing region, and a substrate support positioned inside the plasma processing region, wherein the substrate support is adapted to support a substrate on a substrate supporting surface.

Embodiments of the invention further provide a plasma processing chamber assembly for depositing a layer on a substrate comprising a plasma processing chamber having a processing region, a target positioned in the plasma processing chamber so that a surface of the target forms a wall of the processing region, a magnetron assembly positioned near the target, wherein the magnetron assembly comprises a flexible plate spaced away from the target, a first magnetron region positioned on the flexible plate, wherein the first magnetron region has one or more magnets magnetically coupled to the processing region through the target, a second magnetron region positioned on the flexible plate, wherein the second magnetron region has one or more magnets magnetically coupled to the processing region through the target, and a first actuator an actuator that is adapted to position the flexible plate in a direction generally perpendicular to the surface of the target, and a substrate support positioned inside the plasma processing region, wherein the substrate support is adapted to support a substrate on a substrate supporting surface.

Embodiments of the invention further provide a plasma processing chamber having a processing region and comprising a target in the plasma processing chamber having a first surface facing the processing region, a magnetron in the plasma processing chamber comprising an array of magnets mounted on a flexible plate that faces and is parallel to and is spaced away from an opposite surface of the target, and at least one actuator connected to the magnets and adapted to deflect the flexible plate to change the distance between one or more of the magnets and the target.

Embodiments of the invention further provide a method of depositing a layer on a surface of a substrate, comprising providing a target that has a surface that contacts a processing region, providing a magnetron region that is magnetically coupled to the processing region through the target and is positioned on a flexible plate, depositing a conductive layer on a surface of a substrate that is positioned in the processing region, and adjusting the shape of the flexible plate and the magnetron region, wherein the shape of the flexible plate and the magnetron region is adjusted by the application of a force of varying magnitude that is delivered by an actuator that is coupled to the flexible plate.

Embodiments of the invention further provide a method of improving the uniformity of a layer being deposited on a substrate by physical vapor deposition, comprising varying the distance between one or more arrays of magnets of a magnetron and a target so as to create a non-uniform magnetic field strength across the target.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3E is a more realistic plan view of a rectangularized spiral magnetron according to one aspect of the invention.

FIG. 5A schematically illustrates a plurality of magnetron regions positioned near a target in an exemplary physical vapor deposition chamber.

FIG. 5B illustrates a plot of magnetic field strength versus the distance along a path that extends across and through the center of a target that may be used in an exemplary physical vapor deposition chamber.

DETAILED DESCRIPTION

The present invention generally provides an apparatus and method for processing a surface of a substrate in a PVD chamber that has a magnetron assembly whose shape can be distorted to adjust the magnetic field strength in the processing region of the deposition chamber to improve the deposition uniformity. In general, aspects of the present invention can be used for flat panel display processing, semiconductor processing, solar cell processing, or any other substrate processing. The invention is illustratively described below in reference to a physical vapor deposition system for processing large area substrates such as a PVD system, available from AKT, a wholly owned subsidiary of Applied Materials, Inc., Santa Clara, Calif. In one embodiment, the processing chamber is adapted to process substrates that have a surface area of at least about 2000 $cm^2$. In another embodiment, the processing chamber is adapted to process substrates that have a surface area of at least about 19,500 $cm^2$ (e.g., 1300 mm×1500 mm). In one aspect, the processing chamber is adapted to process rectangular substrates. However, it should be understood that the apparatus and method may have utility in other system configurations, including those systems configured to process large area round substrates.

As the size of the substrates increase in size, for example $\geq 19{,}500$ $cm^2$, it is generally not feasible to create a chamber big enough to maintain the surface area ratio of the cathode (target) to anode surface area commonly used in conventional sputter processing chambers. Trying to maintain the surface area ratio can lead to manufacturing difficulties due to the large size of the parts required to achieve the desired area ratio and problems related to the need to pump down such a large volume to a desired base pressure prior to processing. A smaller than desired surface area of the anode relative to the large target surface area generally causes the density of the plasma generated in the processing region (e.g., the region below the target and above the substrate) to vary significantly from the center of the target to the edge of the target. Since the anodic surfaces are commonly distributed around the periphery of the target, it is believed that the larger distance from the center of the target to the anodic surfaces makes the emission of electrons from the target surface at the edge of the target more favorable and thus reduces the plasma density near the center of the target. The reduction in plasma density in various regions across the target face will reduce the number of ions striking the surface of the target in that localized area, resulting in non-uniformity of the deposited film across the surface of a substrate that is positioned a distance from the target face. The insufficient anode area problem will thus manifest itself as a film thickness that is smaller near the center of the substrate relative to the edge.

Figure 1:
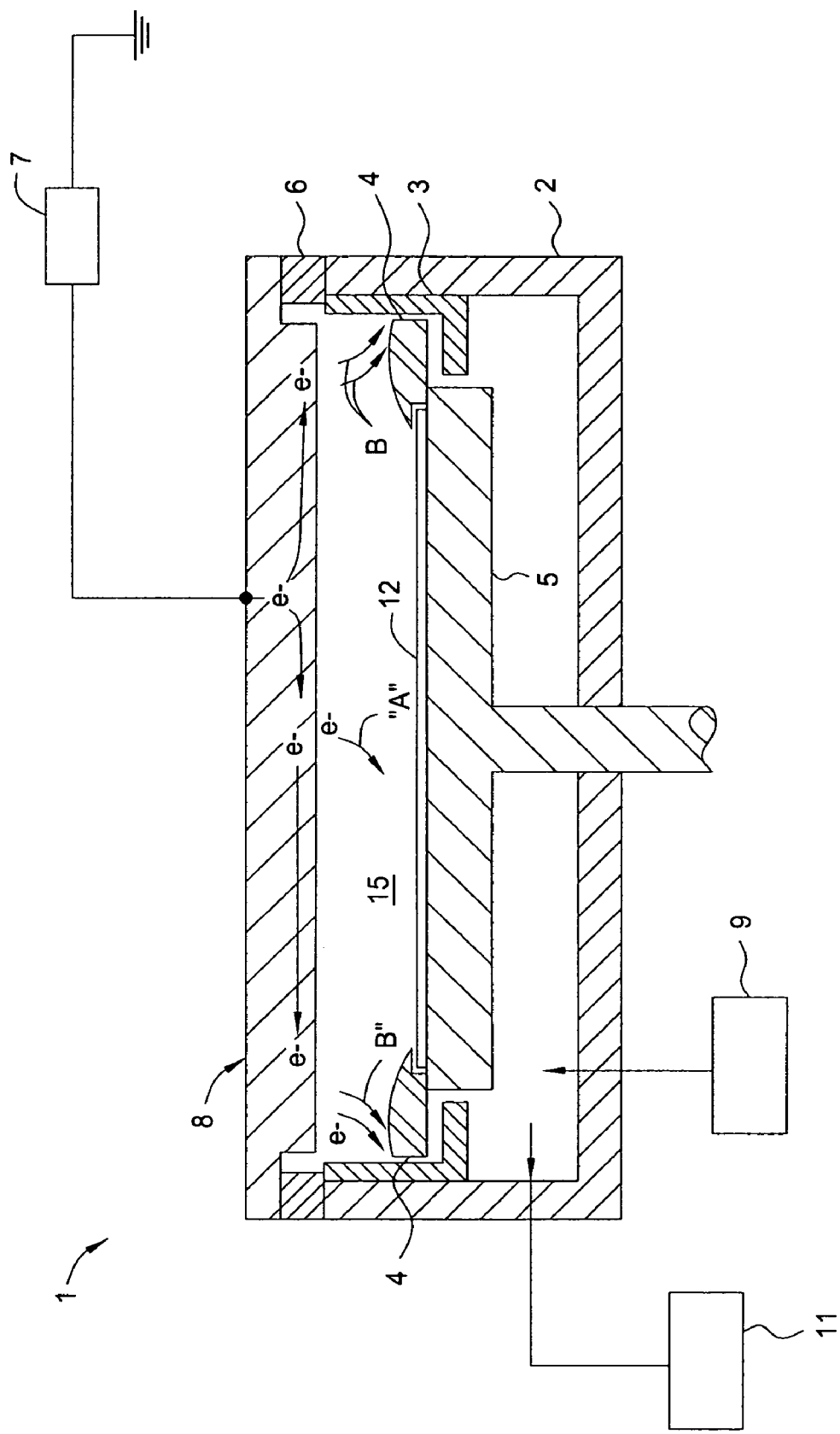
FIG. 1 is a vertical cross-sectional view of conventional physical vapor deposition chamber.

FIG. 1 illustrates a cross-sectional view of the processing region of a conventional physical vapor deposition (PVD) chamber 1. The conventional PVD chamber 1 generally contains a target 8, a vacuum chamber 2, an anode shield 3, a shadow ring 4, a target electrical insulator 6, a DC power supply 7, a process gas source 9, a vacuum pump system 11 and a substrate support 5. To perform a sputtering process, a process gas, such as argon, is delivered into the evacuated conventional PVD chamber 1 from the gas source 9 and a plasma is generated in the processing region 15 due to a negative bias created between the target 8 and the anode shield 3 by use of the DC power supply 7. In general, the plasma is primarily generated and sustained by the emission of electrons from the surface of the target due to the target bias and secondary emission caused by the ion bombardment of the negative (cathodic) target surface. Prior to performing the PVD processing step(s) it is common for the vacuum chamber 2 to be pumped down to a base pressure (e.g., $10^{-6}$ to $10^{-9}$ Torr) by use of the vacuum pump system 11.

FIG. 1 is intended to illustrate one of the believed causes of the plasma non-uniformity in a large area substrate processing chamber by highlighting the path difference between an electron (see $e^-$) ejected from the surface of the target 8 near the center of the target (see path "A") and electrons emitted from the surface of the target (e.g., secondary emission) near the edge (see path "B"). While the longer path to the anode, typically a grounded surface, experienced by an electron leaving the center of the target may increase the number of collisions the electron will undergo before it is lost to the anode surface or recombined with an ion contained in the plasma, the bulk of the electrons emitted from the target 8 will be emitted near the edge of the target due to the reduced electrical resistance of this path to ground. The reduced electrical resistance of the path near the edge of the target to ground is due to the lower resistance path through the conductive target 8 material(s) and the shorter path length ("B") of the electron's path to ground. It is believed that the lower resistance path thus tends to increase the current density and plasma density near the edge of the target thus increasing the amount of material sputtered at the edge versus the center of the target 8.

Process Chamber Hardware

Figure 2A:
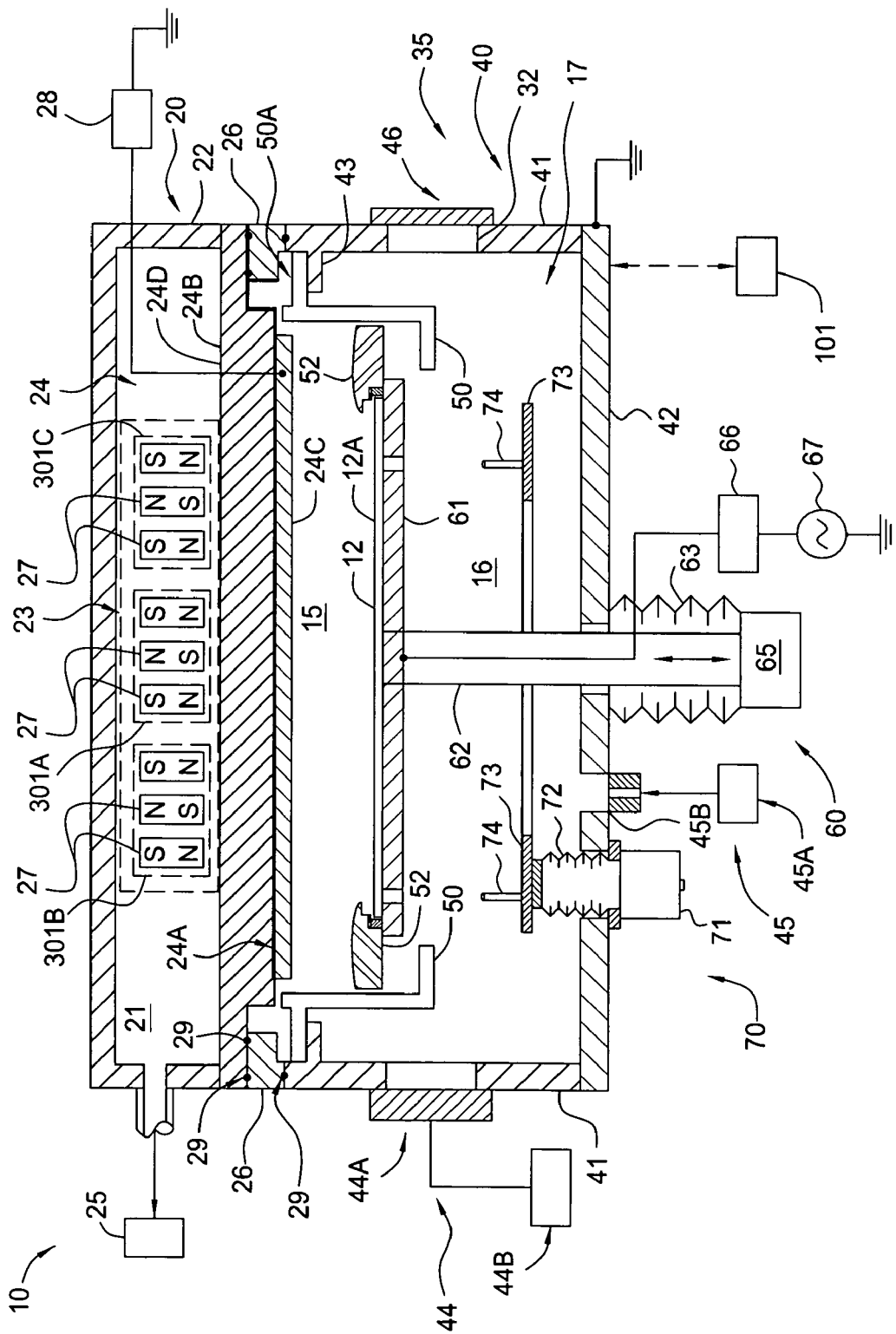
FIG. 2A is a vertical cross-sectional view of an exemplary physical vapor deposition chamber.

FIG. 2A illustrates a vertical cross-sectional view of one embodiment of a processing chamber 10 that may be used to perform aspects of the invention described herein. In the configuration illustrated in FIG. 2A, the processing chamber 10 contains a magnetron assembly 23 that has one or more magnetron regions 301 (e.g., elements 301A-301C in FIG. 2A) that are used to tailor and/or more evenly distribute the generated magnetic field throughout the processing region 15. FIG. 2A illustrates a substrate 12 that is positioned in a processing position in the processing region 15. In general, the processing chamber 10 contains a lid assembly 20 and a lower chamber assembly 35.

A. Lower Chamber Assembly Hardware

The lower chamber assembly 35 generally contains a substrate support assembly 60, chamber body assembly 40, a shield 50, a process gas delivery system 45 and a shadow frame 52. The shadow frame 52 is generally used to shadow the edge of the substrate to prevent or minimize the amount of deposition on the edge of a substrate 12 and substrate support 61 during processing (see FIG. 2A). The chamber body assembly 40 generally contains one or more chamber walls 41 and a chamber base 42. The one or more chamber walls 41, the chamber base 42 and target 24 generally form a vacuum processing area 17 that has a lower vacuum region 16 and a processing region 15. In one aspect, a shield mounting surface 50A of the shield 50 is mounted on or connected to a grounded chamber shield support 43 formed in the chamber walls 41 to ground the shield 50. The process gas delivery system 45 generally contains one or more gas sources 45A that are in fluid communication with one or more inlet ports 45B that are in direct communication with the lower vacuum region 16 (shown in FIG. 2A) and/or the processing region 15, to deliver a process gas that can be used during the plasma process. Typically, the process gas used in PVD type applications is, for example, an inert gas such as argon, but other gases such as nitrogen may be used.

The substrate support assembly 60 generally contains a substrate support 61, a shaft 62 that is adapted to support the substrate support 61, and a bellows 63 that is sealably connected to the shaft 62 and the chamber base 42 to form a moveable vacuum seal that allows the substrate support 61 to be positioned in the lower chamber assembly 35 by the lift mechanism 65. The lift mechanism 65 may contain a conventional linear slide (not shown), pneumatic air cylinder (not shown) and/or DC servo motor that is attached to a lead screw (not shown), which are adapted to position the substrate support 61 and substrate 12 in a desired position in the processing region 15. In one embodiment, the substrate support 61 may contain RF biasable elements (not shown) embedded within the substrate support 61 that can be used to capacitively RF couple the substrate support 61 to the plasma generated in the processing region 15 by use of an RF power source 67 and RF matching device 66. The ability to RF bias the substrate support 61 may be useful to help improve the plasma density, improve the deposition profile on the substrate, and increase the energy of the deposited material at the surface of the substrate.

Referring to FIG. 2A, the lower chamber assembly 35 will also generally contain a substrate lift assembly 70, slit valve 46 and vacuum pumping system 44. The lift assembly 70 generally contains three or more lift pins 74, a lift plate 73, a lift actuator 71, and a bellows 72 that is sealably connected to the lift actuator 71 and the chamber base 42 so that the lift pins 74 can remove and replace a substrate positioned on a robot blade (not shown) that has been extended into the lower chamber assembly 35 from a central transfer chamber (not shown). The extended robot blade enters the lower chamber assembly 35 through the access port 32 in the chamber wall 41 and is positioned above the substrate support 61 that is positioned in a transfer position (not shown). The vacuum pumping system 44 (elements 44A and 44B) generally contains a cryo-pump, turbo pump, cryo-turbo pump, rough pump, and/or Roots Blower to evacuate the lower vacuum region 16 and processing region 15 to a desired base and/or processing pressure. A slit valve actuator (not shown) which is adapted to position the slit valve 46 against or away from the one or more chamber walls 41 may be a conventional pneumatic actuator.

To control the various processing chamber 10 components and process variables during a deposition process, a controller 101 is used. The processing chamber's processing variables may be controlled by use of the controller 101, which is typically a microprocessor-based controller. The controller 101 is configured to receive inputs from a user and/or various sensors in the plasma processing chamber and appropriately control the plasma processing chamber components in accordance with the various inputs and software instructions retained in the controller's memory. The controller 101 generally contains memory and a CPU which are utilized by the controller to retain various programs, process the programs, and execute the programs when necessary. The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like all well known in the art. A program (or computer instructions) readable by the controller 101 determines which tasks are performable in the plasma processing chamber. Preferably, the program is software readable by the controller 101 and includes instructions to monitor and control the plasma process based on defined rules and input data.

B. Lid Assembly and Magnetron Hardware

The lid assembly 20 generally contains a target 24, a lid enclosure 22, a ceramic insulator 26, one or more o-ring'seals 29 and a magnetron assembly 23 that are positioned in a target backside region 21. In one aspect, the ceramic insulator 26 is not required to provide electrical isolation between the backing plate 24B of the target 24 and the chamber body assembly 40. In one aspect of the process chamber 10, a vacuum pump 25 (FIG. 2A) is used to evacuate the target backside region 21 to reduce the stress induced in the target 24 due to the pressure differential created between the processing region 15 and the target backside region 21 during processing. The typically less than atmospheric pressure formed in the processing region 15 is created by use of the vacuum pumping system 44 (discussed below). The reduction in the pressure differential across the target 24 can be important for process chambers 10 that are adapted to process large area substrates greater than 2000 cm$^2$ to prevent the large deflections of the center of the target 24. Large deflections are often experienced even when the pressure differential is about equal to atmospheric pressure (e.g., 14 psi).

Figure 2B:
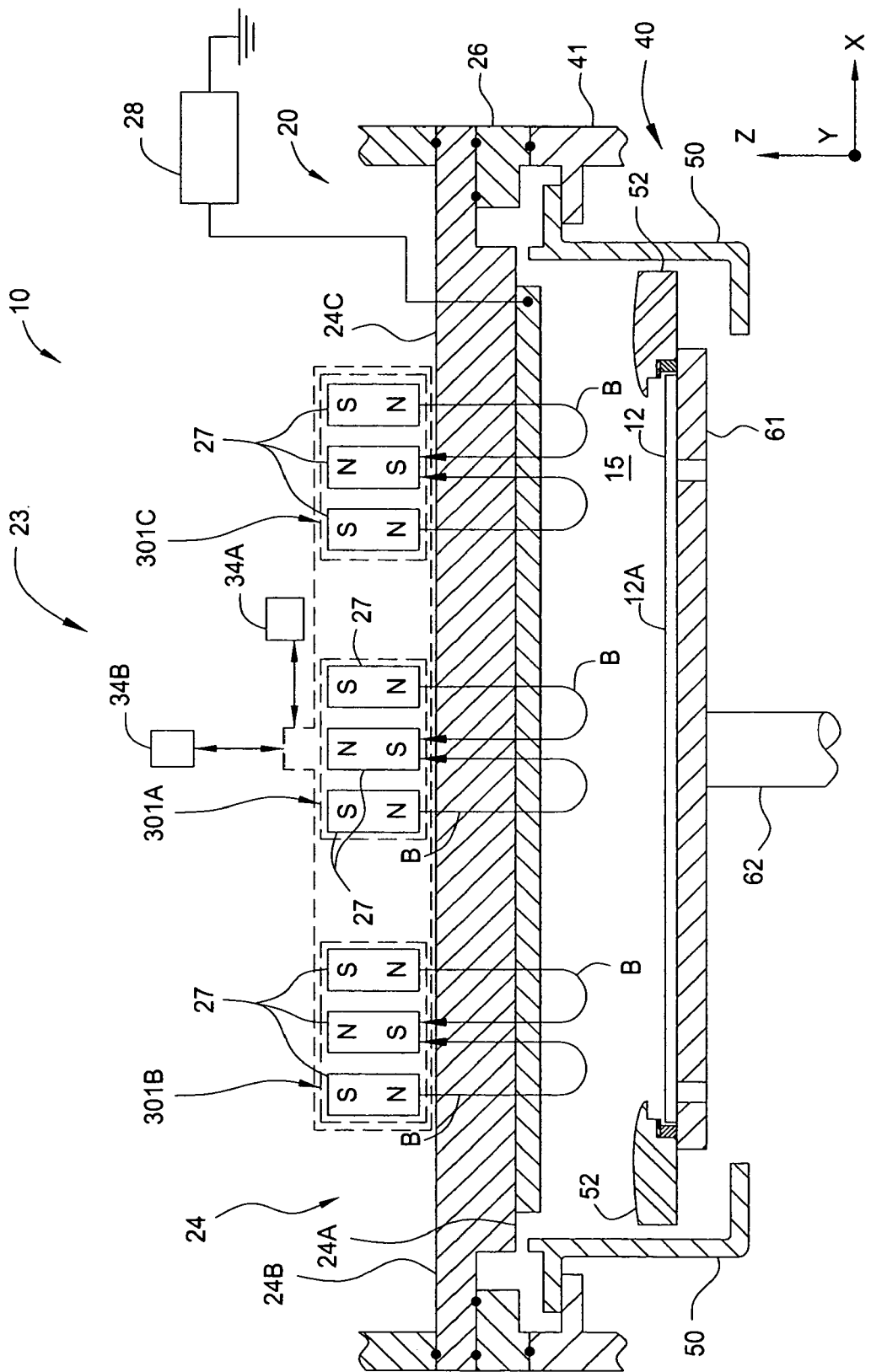
FIG. 2B is a vertical cross-sectional view of a processing region formed in an exemplary physical vapor deposition chamber.

The sputter deposited film uniformity can be affected by the deflection, or bowing, of the target since it will cause the magnetic field strength generated by a conventional planar magnetron to vary from the center to the edge of a target 24 because the center of the target is moving a farther distance away from the conventional planar magnetron than the edge of the target and thus the magnetic field strength in the processing region 15 will be reduced in the center region of the target. The reduction in magnetic field strength will affect the plasma density uniformity across the target surface 24C and thus the sputter deposition profile on the processing surface of the substrate. To resolve this issue, embodiments of the invention generally utilize a magnetron assembly 23 that contains one or more magnetron regions (e.g., elements 301A-C in FIG. 2B) that are positionable relative to the target backside surface 24D, and thus the target surface 24C and processing region 15. In one embodiment, the magnetron assembly 23 contains two or more magnetron regions (e.g., three shown in FIGS. 2A and 2B) that are positionable relative to the target surface 24C, and each contains at least one magnet 27 that has a pair of opposing magnetic poles (i.e., north (N) and south (S)) that create a magnetic field (B-field) that passes through the target 24 and the processing region 15 (see element "B" in FIG. 2B). FIGS. 2A and 2B illustrate a cross-section of one embodiment of a processing chamber 10 that has one magnetron assembly 23 that contains three magnetron regions 301 (e.g., 301A-301C in FIG. 2B), positioned at the back of the target 24. It should be noted that while the target 24, illustrated in FIG. 2A, has a backing plate 24B and target material 24A, other embodiments of the invention may use a solid, or monolithic, type target without varying from the basic scope of the invention.

The magnetron regions 301 (e.g., 301A-301C) have an effect on the shape and uniformity of the PVD deposited layer due to the strength and orientation of the magnetic fields generated by the magnetron regions. In general, each of the magnetron regions will contain at least one magnet 27. The magnets 27 may be permanent magnets (e.g., neodymium, samarium-cobalt, ceramic, or Alnico) or electromagnets. In one embodiment of the processing chamber 10, each magnetron region is adapted to deliver a constant or varying magnetic field strength using electromagnets as a function of time and/or position relative to the center of the target 24. In this configuration the single magnetron assembly 23 may contain two or more regions that have differing magnetic field strengths that are optimized to achieve a desired plasma density and sputter deposition profile. The term sputter deposition profile is intended to describe the deposited film thickness as measured across the substrate processing surface (element 12A in FIG. 2A) of the substrate 12.

Referring to FIGS. 2 and 2B, in one embodiment of the processing chamber 10, the two or more magnetron regions (elements 301A-C) are distributed across the target 24 to balance out the difference in current flow between the center and edge of the target caused by the differing resistance to the anode (e.g., ground) for each of these electrical paths. The control of the magnetic field distribution from the center to the edge of the target 24 is used to control and improve plasma density and thus the deposition uniformity across the processing surface. In one aspect, the magnetic field strength of the magnetron regions are configured to deliver a higher magnetic field strength in the center of the target 24 rather than at the edge of the target.

In one aspect, the magnetron assembly 23 is smaller in size than the target 24 and is translated across the back of the target 24 to assure full utilization of the target surface 24C. Referring to FIG. 2B, in one embodiment, to improve utilization of the target material and improve deposition uniformity the magnetron regions 301A-301C are translated (e.g., raster, scan, and/or rotate) in at least one of the directions (X and/or Y directions) that are parallel to the target surface 24C by use of one or more horizontal magnetron actuators 34A. In one aspect, where X and Y motion of one or more of the magnetron regions is desired, two or more orthogonally oriented magnetron actuators 34A may be used to adjust the magnetron's position in the X-Y plane. The horizontal magnetron actuators 34A may be a linear motor, stepper motor, or DC servo motor that is adapted to position and move the magnetron assembly in a desired direction at a desired speed by use of commands from the controller 101. In one aspect, each of the horizontal actuators 34A may contain an independently controlled motor (e.g., linear motor, stepper motor, or DC servo motor) that is coupled to a worm gear drive, or lead screw, so that the coupled magnetron assembly 23 can be accurately positioned horizontally by commands from the controller 101. A translation mechanism that may be used to move the magnetron and be adapted to benefit the invention described herein is further described in the commonly assigned U.S. patent application Ser. No. 10/863,152 [AMAT 8841], filed Jun. 7, 2004, which claims the benefit of U.S. Provisional Patent Application Ser. No. 60/534,952, filed Jan. 7, 2004, and U.S. patent application Ser. No. 10/863,152 [AMAT 8841.P1], filed Aug. 24, 2005, which are hereby incorporated by reference in its entirety to the extent not inconsistent with the claimed invention.

In another embodiment, the magnetron regions 301 are translated in at least one of the directions that are perpendicular (Z-direction) to the target surface 24C by use of one or more vertical magnetron actuators 34B. The ability to position a magnetron assembly 23 in a position perpendicular to the target surface 24C will affect the magnetic field strength formed in the processing region 15 and thus the plasma density in the regions below the target surface 24C. Generally, moving a magnetron assembly 23 closer to the target 24 will increase the magnetic field strength in the processing region 15 while moving the assembly 23 farther away from the target 24 will reduce the magnetic field strength passing through the processing region 15. Therefore, by adjusting the position of each assembly 23 relative to the target surface 24C, the plasma density and sputter deposition profile across the processing surface 12A can be varied or adjusted.

In one embodiment, the position of the magnetron assembly 23 can be adjusted in the X, Y and Z directions (FIG. 2B) as a function of time or position relative to the center of the target 24 by the coordination of the horizontal and vertical magnetron actuators 34A-B by use of the controller 101. The ability to adjust the magnetron region 301 position in the X, Y and Z directions can be useful to adjust and/or tune the magnetic field strength in the processing region 15 and thus the sputter deposition profile received on the processing surface 12A of the substrate 12.

Magnetron Assembly with Magnetron Regions

Figure 3A:
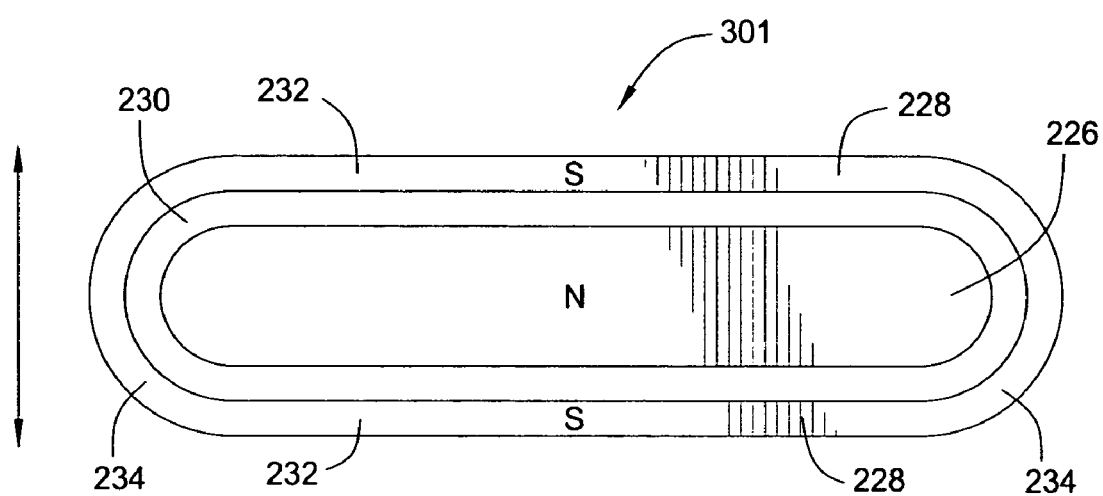
FIG. 3A is a plan view of a linear magnetron usable with the sputter reactor of FIG. 2A.

FIG. 3A illustrates a plan view of a magnetron region 301 that has two poles 228 and 226 which are typically positioned parallel to the front face of the target 24 (FIG. 2B). In one aspect, as shown in FIG. 3A, the magnetron assembly 23 may be formed by a plurality of magnetron regions, each of which contain a central pole 226 of one magnetic polarity surrounded by an outer pole 228 of the opposite polarity to project a magnetic field within the processing region 15 of chamber 10 (FIG. 2B). The two poles 226, 228 are separated by a substantially constant gap 230 over which a high-density plasma is formed under the correct chamber conditions and gas flows in a closed loop or track region. The outer pole 228 consists of two straight portions 232 connected by two semi-circular arc portions 234. The magnetic field formed between the two poles 226, 228 traps electrons and thereby increases the density of the plasma and as a result increases the sputtering rate. The relatively small widths of the poles 226, 228 and of the gap 230 produce a high magnetic flux density. The closed shape of the magnetic field distribution along a single closed track forms a plasma loop generally following the gap 230 and prevents the plasma from leaking out the ends of the formed plasma. In one aspect, it may not be desirable to form a closed shape of the magnetic field distribution. During the PVD deposition process a large portion of the generated plasma in the processing region 15 is formed and is retained below the magnetron assemblies 23 in the plasma loop due to the magnetic fields (elements "B" in FIG. 2B) containment of the electrons found in the processing region 15. The optimum shape of the generated plasma will vary from one substrate size to another, from the ratio of the anode (e.g., grounded surface) to cathode (e.g., target) surface area, target to substrate spacing, PVD process pressure, motion of the magnetron region(s) across the target face, desired deposition rate, and type of material that is being deposited. The effectiveness of the configuration of the magnetron assembly 23 to reduce the center to edge deposited thickness variation depends upon by the magnetic permeability of the target material(s) and the translation of the magnetron assembly 23. Therefore, in some cases the magnetron magnetic field pattern may need to be adjusted based on the type of target 24 material(s) and their thickness(es).

Figure 3B:
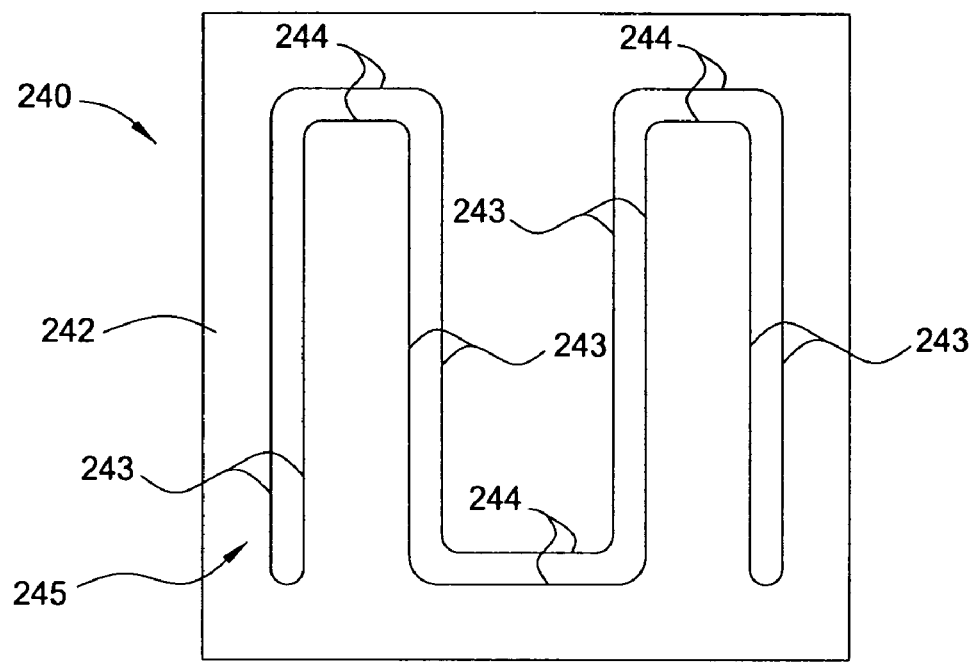
FIG. 3B is a schematic plan view of a plasma loop formed by a serpentine magnetron according to one aspect of the invention.
Figure 3C:
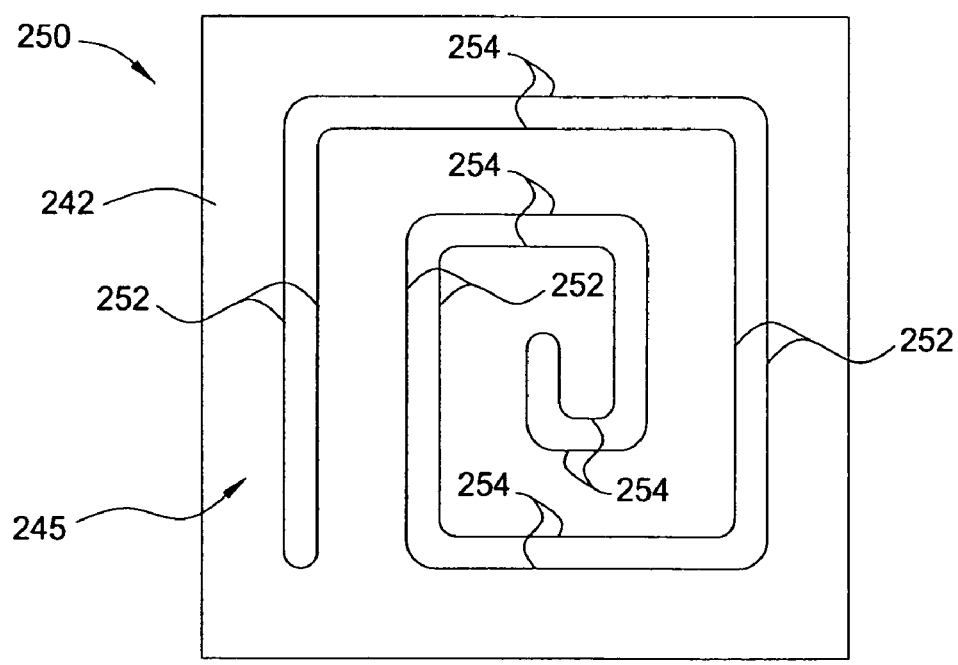
FIG. 3C is a schematic plan view of a plasma loop formed by a rectangularized spiral magnetron according to one aspect of the invention.

In one embodiment, as illustrated in FIG. 3A, at least one of the magnetron regions 301 is formed using a central pole and outer pole that have a convoluted shape (FIGS. 3B and 3C) rather than a linear shape (FIG. 3A). FIGS. 3B and 3C schematically illustrates the shape of a plasma loop 245 created in the processing region 15 of a plasma processing chamber below a target 242, which is formed using two different convoluted magnetron shapes that will hereafter be described as a serpentine magnetron 240 (FIG. 3B) or spiral magnetron 250 (FIG. 3C). Referring to FIG. 3B, to form the plasma loop 245 the serpentine magnetron 240 will generally include multiple long parallel straight portions 243 that are joined by end portions 244. The end portions 244 may be arc shaped or alternatively short straight portions with curved corners connecting them to the straight portions 243. The effective area of the serpentine magnetron 240, or magnetron region, is defined by the outer generally rectangular outline of the magnetic field distribution parallel to the target face, and is a substantial fraction of target area. Referring to FIG. 3C, in a related embodiment, a plasma loop 245 may be formed using a spiral magnetron 250 that includes a series of straight portions 252 and 254 that extend along perpendicular axes and are smoothly joined together to form a plasma loop that has a rectangular spiral shape.

The plasma loop formed by the magnetron shapes illustrated in FIGS. 3B and 3C are intended to be a schematic representation of some magnetron region configurations that may be useful to perform various aspects of the invention described herein. One will note that the number of folds and the distance between the plasma loops in either magnetron 240, 250 may be significantly adjusted as required to achieve a desired process uniformity or deposition profile. Although it is not necessary, each of the magnetrons may be considered a folded or twisted version of an extended racetrack magnetron of FIG. 3A with a plasma loop formed between the inner pole and the surrounding outer pole.

Figure 3D:
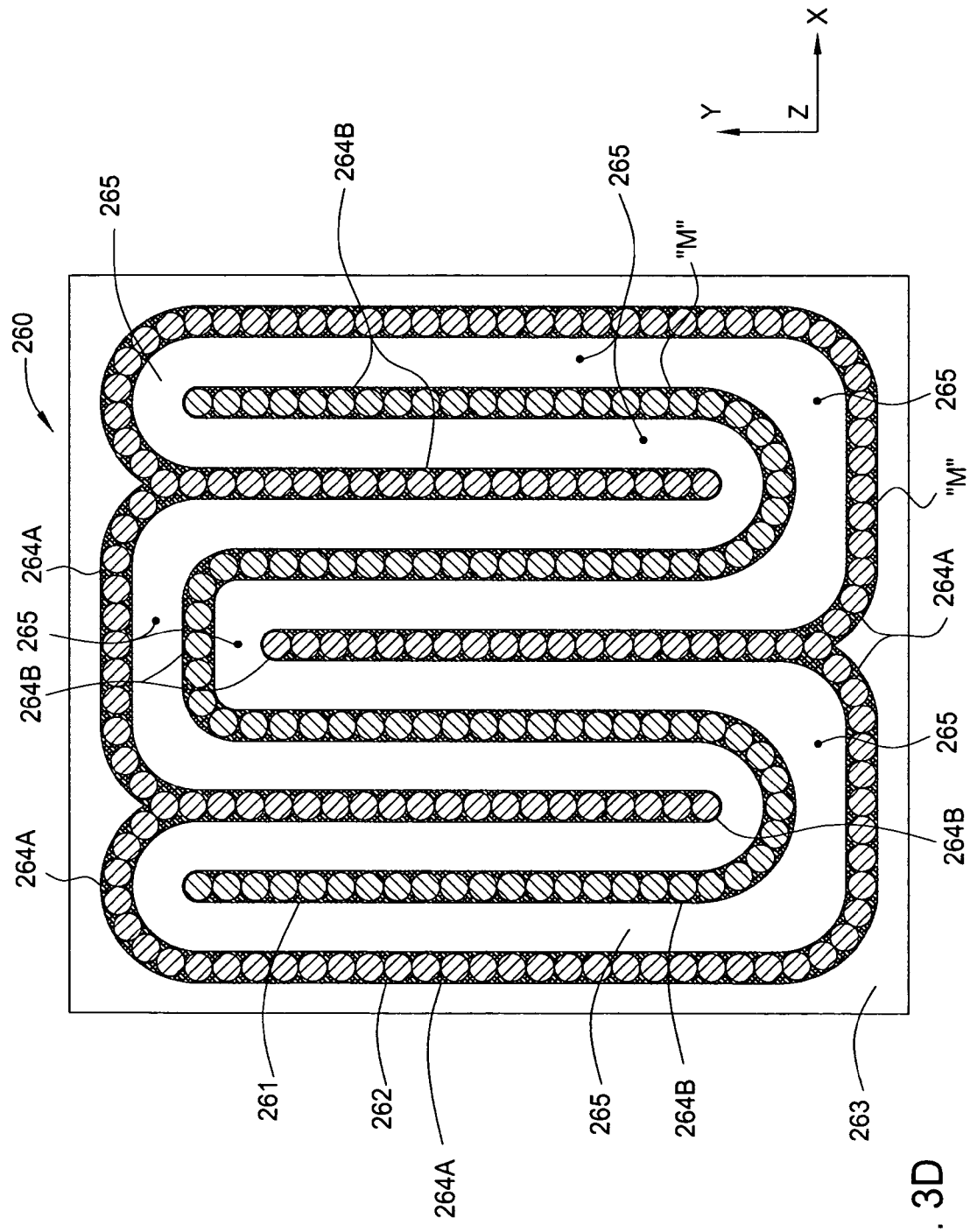
FIG. 3D is a more realistic plan view of a serpentine magnetron according to one aspect of the invention.

FIGS. 3D and 3E illustrate a-serpentine magnetron assembly 260 (FIG. 3D) and spiral magnetron assembly 270 (FIG. 3E), that are closed convoluted magnetron shapes that are useful to perform aspects of the invention described herein. In one aspect, one or more of the magnetron regions (e.g., elements 301A-B) may contain a serpentine magnetron assembly 260 or spiral magnetron assembly 270. FIG. 3D schematically illustrates one embodiment of a serpentine magnetron assembly 260 that has an array of magnets (e.g., hatched circles) that are aligned and arranged in grooves 264A-B formed in the magnetron plate 263 to form a first pole 261 and a second pole 262. The two opposing poles, such as first pole 261 and the second pole 262, form a magnetic field in the gaps 265 formed between the first pole 261 and second pole 262. In one aspect, the serpentine magnetron assembly 260, as illustrated in FIG. 3D, is formed using an array of magnets 27 that are oriented so that the first pole 261 forms the north pole (elements "N") of the serpentine magnetron assembly and the second pole 262 forms the south pole (elements "S") of the serpentine magnetron assembly. In one aspect, (not shown) the width of the outer grooves 264A, which are at the edge of the serpentine magnetron assembly is generally about half the widths of the inner grooves 264B since the outer grooves 264A accommodate only a single row of magnets while the inner groove 264B accommodate two rows of magnets (not shown) in a staggered arrangement to balance the generated magnetic field strength between the poles. In one aspect, a single magnetic yoke plate (not shown) may cover the back of the magnetron plate 263 to magnetically couple the poles of all the magnets. In one aspect, the magnets positioned in grooves 264A and 264B are capped with their respective pole pieces that are typically formed of magnetically soft stainless steel and have a shape and width that is approximate by equal to the formed grooves 264A or 264B.

Figure 3F:
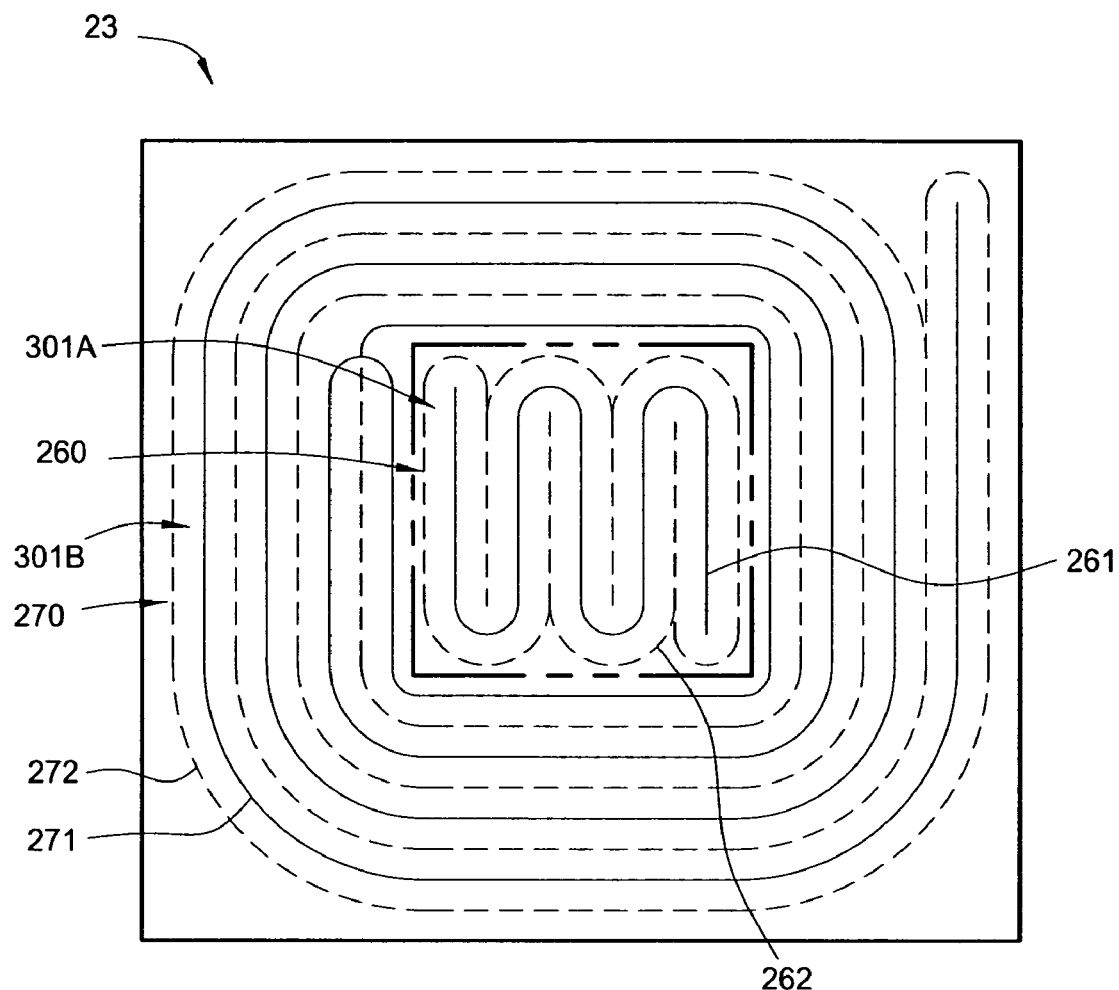
FIG. 3F is a plan view of a magnetron assembly having two magnetron regions according to one aspect of the invention.

FIG. 3E illustrates one embodiment of a spiral magnetron assembly 270 that has an array of magnets (e.g., hatched circles) that are aligned and arranged in grooves 274A-B formed in the magnetron plate 273 to form a first pole 271 and a second pole 272. The two opposing poles, such as first pole 271 and the second pole 272, form a magnetic field in the gaps 275 formed between the first pole 271 and second pole 272. In one aspect, the spiral magnetron assembly 270, as illustrated in FIG. 3F, is formed using an array of magnets that are oriented so that the first pole 271 forms the north pole (elements "N") of the spiral magnetron assembly and the second pole 272 forms the south pole (elements "S") of the spiral magnetron assembly. In one aspect, (not shown) the width of the outer grooves 274A, which are at the edge of the spiral magnetron assembly is generally about half the width of the inner grooves 274B, since the outer grooves 274A accommodate only a single row of magnets while the inner groove 274B accommodate two rows of magnets in a staggered arrangements to balance the generated magnetic field strength between the poles. In one aspect, a single magnetic yoke plate may cover the back of the magnetron plate 273 to magnetically couple the poles of all the magnets. In one aspect, the magnets 27 positioned in grooves 274A and 274B are capped with their respective pole pieces that are typically formed of magnetically soft stainless steel and have a shape and width that is approximate equal to the formed grooves 274A or 274B.

FIG. 3F illustrates plan view of one embodiment of a magnetron assembly 23 that has two magnetron regions 301A and 301B. In this configuration the first magnetron region 301A is nested within the second magnetron region 301B. In one aspect, as shown in FIG. 3F, the first magnetron region 301A has a serpentine magnetron assembly 260 arrangement of magnets and the second magnetron region 301B has a spiral magnetron assembly 270 arrangement of magnets. One will note that the outer pole 272 in the second magnetron region 301B and the outer pole 262 in the first magnetron region 301A are schematically illustrated as dashed lines (e.g., south pole), and the inner pole 271 in the second magnetron region 301B and the inner pole 261 in the first magnetron region 301A are schematically illustrated as solid lines (e.g., north pole).

Figure 3G:
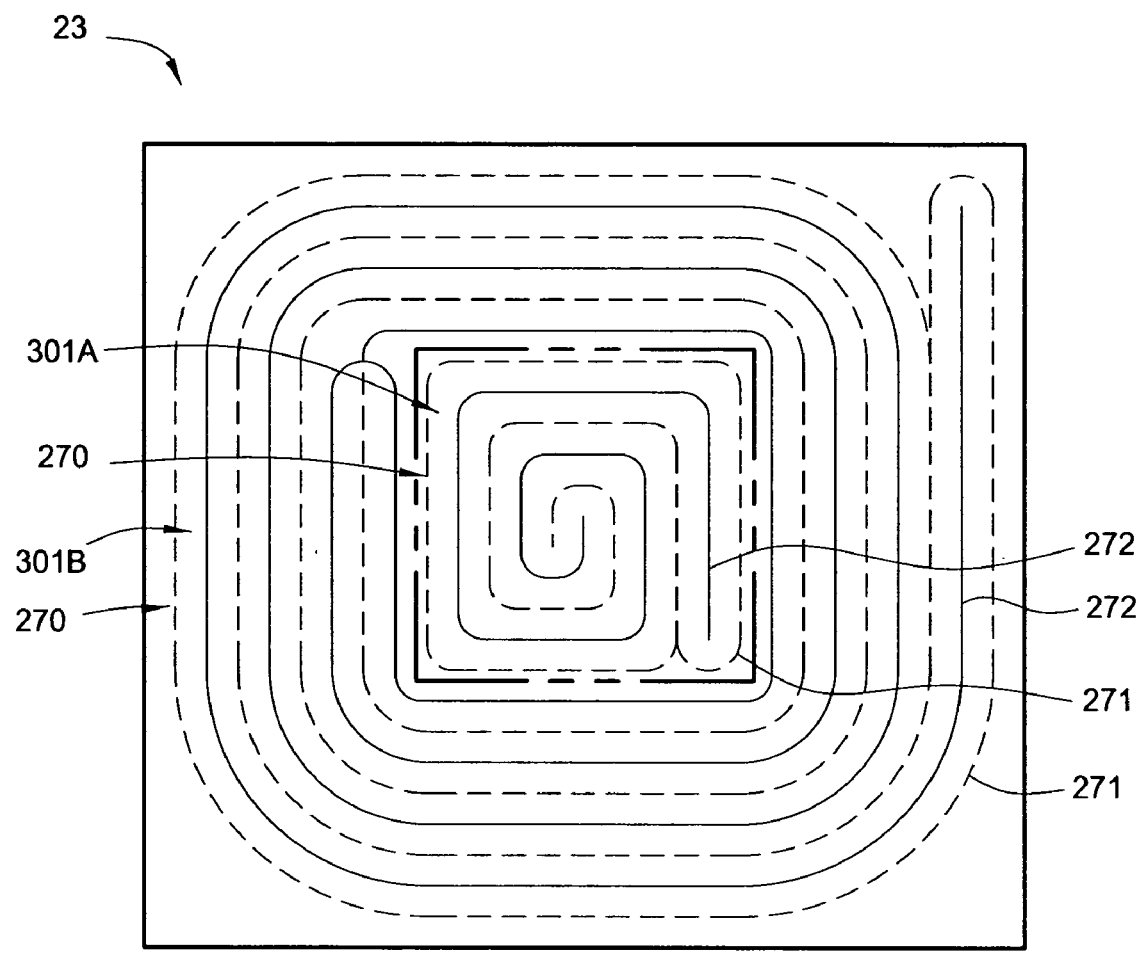
FIG. 3G is a plan view of a magnetron assembly having two magnetron regions according to one aspect of the invention.

FIG. 3G illustrates a plan -view of one embodiment of a magnetron assembly 23 that has two magnetron regions 301A and 301B. In this configuration the first magnetron region 301A is nested within the second magnetron region 301B. In one aspect, as shown in FIG. 3G, the first and second magnetron regions 301A-B utilize a spiral magnetron assembly 270 magnet arrangement. One will note that the outer pole 272 in the second magnetron region 301B and the outer pole 272 in the first magnetron region 301A are schematically illustrated as dashed lines, and the inner pole 271 in the second magnetron region 301B and the inner pole 271 in the first magnetron region 301A are schematically illustrated as solid lines.

Magnetron Shape Variation

Figure 4A:
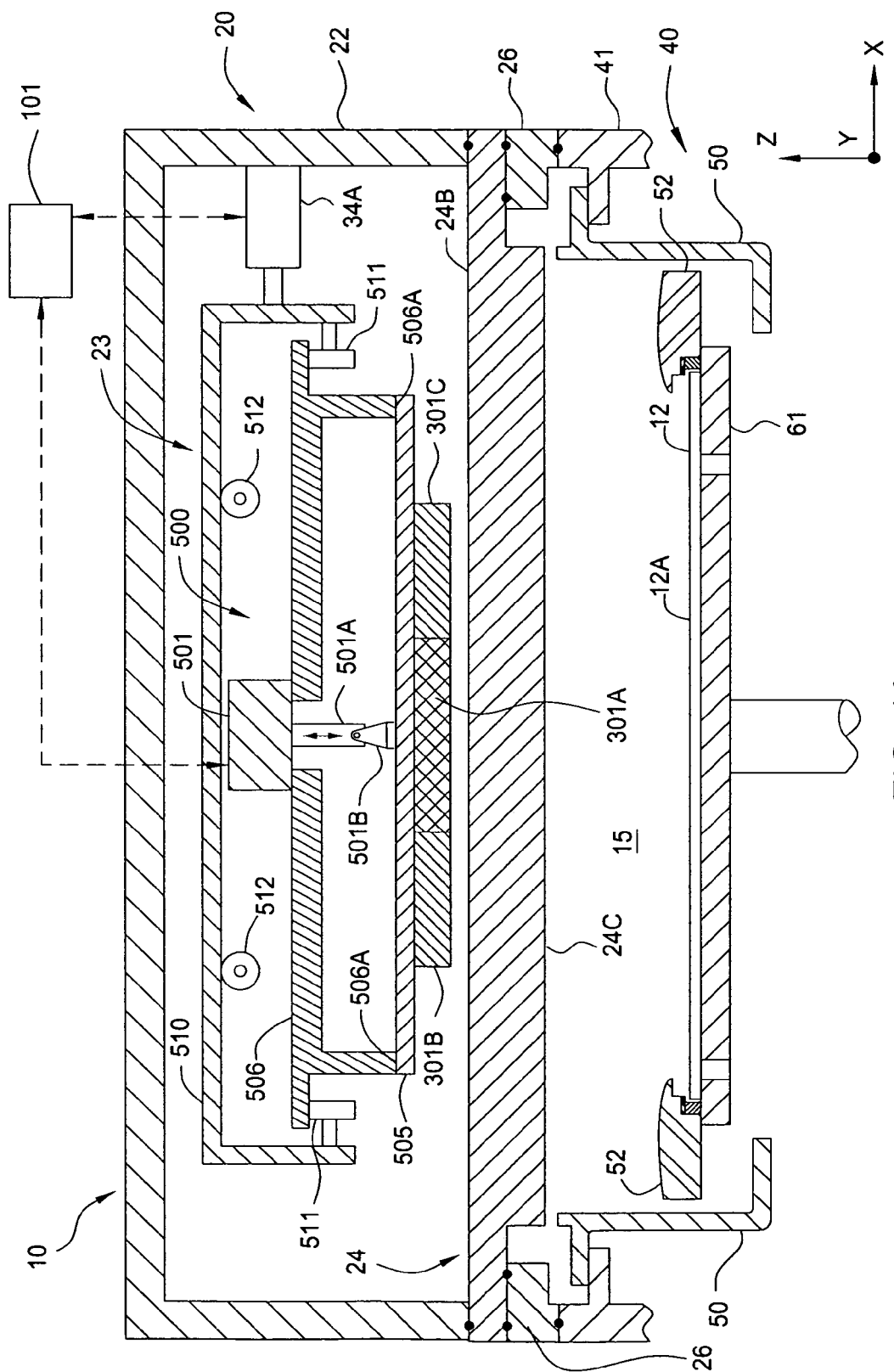
FIG. 4A is a vertical cross-sectional view of a processing region formed in an exemplary physical vapor deposition chamber.

In one embodiment, the magnetic field strength delivered to the processing region 15 is varied by the adjustment of the shape of the magnetron assembly 23 to achieve a desired magnetic field strength profile across the target 24. FIG. 4A illustrates a vertical cross-sectional view of a portion of a processing chamber 10 that contains a magnetron deflection assembly 500 that is adapted to distort the shape of the one or more magnetron regions (e.g., elements 301A-301C) to achieve a desired magnetic field profile in the processing region 15 and, thus, a desired deposition profile on the substrate surface 12A. In one aspect, the shapes of the magnetron sections 301 are distorted by use of the magnetron deflection assembly 500 while the magnetron assembly 23 is translated in at least one of the X, Y, and Z directions to further improve the magnetic field strength distribution across the target 24 and deposition profile on the substrate 12. In general, the magnetron deflection assembly 500 contains a support plate 506, one or more deflection actuators 501, and a flexible plate 505 to which the magnetron regions (e.g., 301A-301C) are attached. The flexible plate 505 is generally attached (e.g., bolted, welded) to the support plate 506 at the connection points 506A. In one embodiment, the one or more deflection actuators 501, only one shown in FIG. 4A, are attached to the support plate 506 so that the positioning rod 501A of the deflection actuator 501, which is in contact with or is connected to the flexible plate 505 (e.g., connection 501B), is able to cause the flexible plate 505 to change its shape, or distort, due to the force generated by an actuating means (not shown) contained in the deflection actuator 501. The force generated by the actuating means thus causes the positioning rod 501A to extend or retract relative to the support plate 506, which causes the flexible plate 505 to change its shape, or distort. The actuating means (not shown) in the deflection actuators 501 may be an air cylinder, linear motor, stepper motor, DC servo motor or other similar device that is adapted to position the positioning rod 501A in a desired direction by use of commands from the controller 101. In one aspect, the deflection actuators 501 may contain an independently controlled actuating means (e.g., linear motor, stepper motor, or DC servo motor) that is coupled to a worm gear drive, or lead screw, so that the shape of the flexible plate 505 can be accurately controlled by commands from the controller 101.

In one aspect of the magnetron deflection assembly 500, the flexible plate 505 is a single magnetic yoke that covers the back of the magnetron regions 301 to magnetically couple the poles of the magnets (see FIG. 3D). In one aspect, the flexible plate 505 is formed from a magnetically soft stainless steel (e.g., ferritic stainless steels) and that has a shape and thickness that allows it to be repeatably deflected in a desired shape. It is generally, desirable to assure that the flexible plate 505 will not plastically deform under the generated force, or will not fail due to fatigue after the repeated application of force, from the actuating means in the deflection actuator 501. In this configuration the thickness of the flexible plate is selected to allow a desired deflection due to the application of a force from the deflection actuator 501. In one aspect, the thickness (Z-direction) of the flexible plate 505 may be varied along its length (X-direction) and/or width (Y-direction), or from center to edge, to achieve a desired deflected shape of the flexible plate 505. In one aspect, an array of channels, grooves, holes, and/or slots may be cut into a surface or through the flexible plate 505 to better achieve a desired deflected shape due to the load delivered from the one or more of the deflection actuators 501.

Referring to FIG. 4A, in one embodiment of the magnetron assembly 23 the magnetron deflection assembly 500 is adapted to be translated across the back of the target 24 to assure full utilization of the target surface 24C. In one embodiment, to improve utilization of the target material and improve deposition uniformity the magnetron regions 301A-301C are translated in at least one of the directions (X and/or Y directions) that are parallel to the target surface 24C by use of one or more horizontal magnetron actuators 34A. In one aspect, where X and Y motion of the one or more magnetron regions is desired, two or more orthogonally oriented magnetron actuators 34A may be used to adjust the magnetron's position in the X-Y plane. While FIG. 4A only illustrates one horizontal magnetron actuator 34A, this is not intended to be limiting to the scope of the invention.

In one embodiment, the magnetron assembly 23 contains a horizontal motion plate 510 that is adapted to support the magnetron deflection assembly 500. In one aspect, the horizontal motion plate 510 has a plurality of rollers 511 that are attached to a surface of the horizontal motion plate 510 and are adapted to support the magnetron deflection assembly 500. The plurality of rollers 511 thus allow the magnetron deflection assembly 500 to be positioned relative to horizontal motion plate 510 by use of a horizontal actuator (not shown) that may be attached to the horizontal motion plate 510. In one aspect, the horizontal motion plate 510 is supported by a plurality of rollers 512 that are attached to the lid enclosure 22 and thus allow the horizontal motion plate 510 to be positioned relative to the lid enclosure by use of the horizontal actuator 34A (FIG. 4A). In one aspect, the rollers 511 and rollers 512 are conventional rollers or conventional linear ball bearing slides that are adapted to support the weight of and allow relative motion between the various components.

In one embodiment, not shown, the magnetron assembly 23 may be further adapted to be positioned vertically relative to the target 24 by use of a vertical actuator (e.g., 34B FIG. 2B) that is attached to a vertical motion plate (not shown), which supports the weight of the horizontal motion plate 510 and magnetron deflection assembly 500. In this configuration, the rollers 512, which support the horizontal plate 510 and the magnetron deflection assembly 500, are mounted to the vertical motion plate (not shown) that is guided and/or supported by a plurality of vertical rollers (not shown) that are attached to the lid enclosure 22, to thus allow the magnetron assembly 23 to be repeatably positioned in the vertical direction (Z-direction).

Figure 4B:
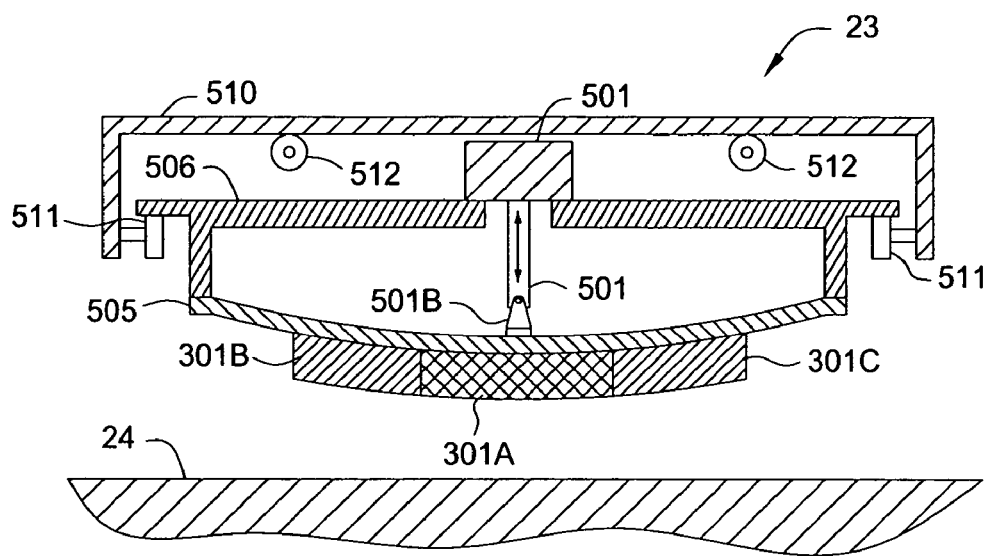
FIG. 4B is a plan view of a magnetron assembly having three magnetron regions according to one aspect of the invention.

FIG. 4B is a vertical cross-sectional view of a magnetron assembly 23 that illustrates a flexible plate 505 which has been distorted due to the force generated by a deflection actuator 501. As shown, the flexible plate 505 has been deflected away from the support plate 506, so that the magnetron regions, especially the center region 301A, are closer to the target 24 and processing region 15. In one aspect, the shape of the flexible plate 505 is adjusted to compensate for the bow of the target 24. In another aspect, the shape of the flexible plate 505 is adjusted during processing to compensate for the deposition non-uniformity found in the substrate surface. In another aspect, the flexible plate 505 may be deflected towards the support plate 506 (not shown) due to a force delivered by the deflection actuator 501. It should be noted that the shape of the distorted magnetron sections shown in FIGS. 4B-4D and 6 have generally been exaggerated to more clearly illustrate the various aspects of the invention described herein. Referring to FIG. 4B, in one aspect, the center region 301A is deflected a distance (e.g., undeflected shape to maximum deflected distance) between about 0.5 mm and about 10 mm by the application of a force delivered from the deflection actuator 501.

Figure 4C:
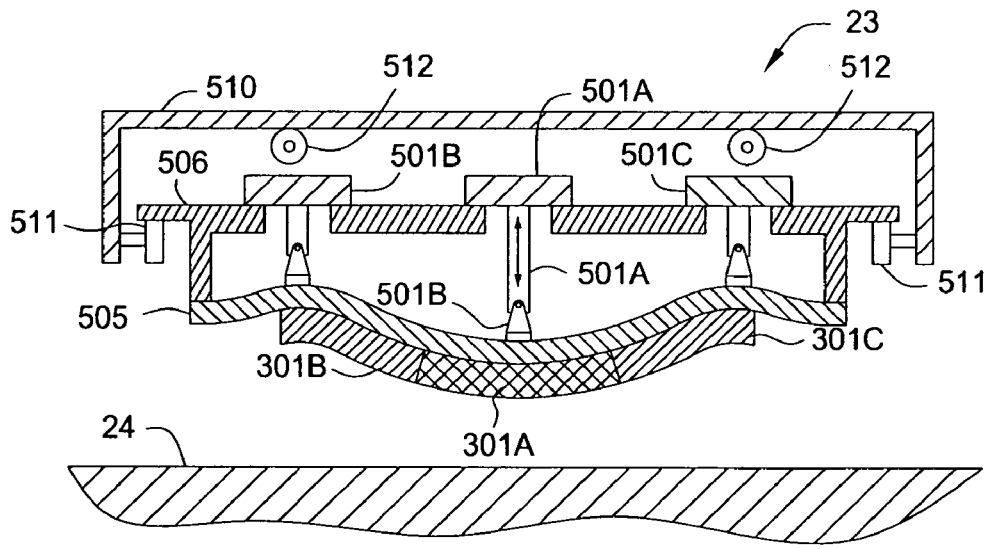
FIG. 4C is a vertical cross-sectional view of a magnetron assembly having three magnetron regions according to one aspect of the invention.

FIG. 4C is a vertical cross-sectional view of a magnetron assembly 23 that illustrates a flexible plate 505 which has been distorted to a desired shape due to the force generated by multiple deflection actuators 501 (e.g., 501A-501C). For example, as shown, the shape of flexible plate 505 has been adjusted so that the center region 301A has been deflected away from the support plate 506 while the edge regions 301B-C are deflected towards the support 506. One will appreciate that by use of multiple deflection actuators 501 the shape of the flexible plate can be adjusted to any desired shape to achieve a desired deposition profile on the surface of the substrate during processing. In one aspect, the shape of the flexible plate 505 may be adjusted by use of the controller 101 (FIG. 4A) and one or more of the deflection actuators 501 during different phases of the deposition process to achieve a desired deposition profile on the substrate surface.

Figure 4D:
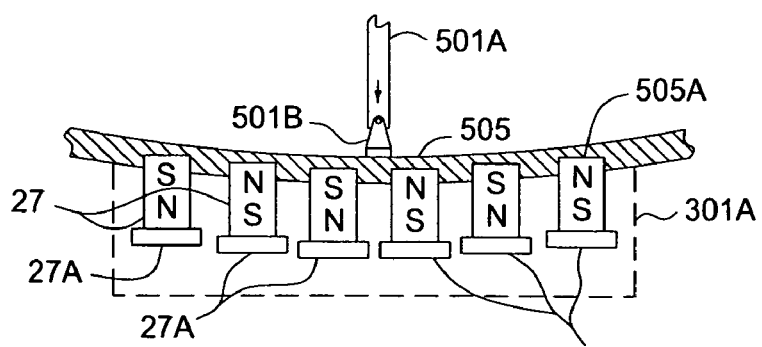
FIG. 4D is a close up vertical cross-sectional view of the magnetron assembly shown in FIG. 4B according to one aspect of the invention.

FIG. 4D is a vertical cross-section of the deflected magnetron region 301A shown in FIG. 4B. In one aspect, as shown in FIG. 4D the magnetron section 301A contains a plurality of magnets 27 and pole pieces 27A that are positioned on a deflected flexible plate 505. In this configuration, one end of the magnets 27 are in contact with the flexible plate 505 and the other end is capped with pole pieces 27A. The pole pieces 27A are typically formed from a magnetically soft stainless steel and have a shape and width that is approximate equal to the formed retaining grooves 505A (i.e., similar to grooves 264A, 264B, 274A, and 274B (FIGS. 3D and 3E)). In one aspect, the thickness and material from which the pole pieces 27A are made allow it to distort in a repeatable manner, due to the distortion of the flexible plate 505. The use of flexible pole pieces 27A may be important to prevent the magnets 27 from being deformed or mechanically failing when the flexible plate 505 is distorted.

Magnetron Motion Control

FIG. 5A schematically illustrates a target 24 that has three magnetron regions (elements 301A-C) that are each adapted to control the magnetic field strength in various regions of the target 24 during processing. The magnetron region 301A is thus adapted to control the magnetic field strength near the center of the target 24 and the magnetron regions 301B-C are adapted to control the magnetic field strength near the edge of the target 24. In one aspect, the magnetic field strength can be adjusted in each of target sections by use of stronger magnets in different regions of the magnetron region 301, increasing the density of the magnets in different regions of the magnetron region 301, using electromagnets that allow one to adjust the delivered magnetic field, and/or increasing the dwell time of each of the magnetron regions 301 over the certain areas of the target as the magnetron is translated in the X, Y and/or Z directions during processing by use of the magnetron actuators 34A-B.

FIG. 5B illustrates a plot of magnitude of the magnetic field as a function of linear distance across the target 24 (in FIG. 5A). The magnetic field strength in this plot may be generated by the static placement of magnets across the target sections, the time average of the magnetic field strength caused by the translation of the magnetron regions 301 (e.g., elements 301A-C) across the target 24, bowing of the flexible plate 505 due to a force generated by one or more deflection actuators 501, and/or the varying of the magnetic field strength by adjusting the current delivered to the one or more electromagnets in the magnetron regions 301. The plot shown in FIG. 5B illustrates the magnitude of the magnetic field in a linear path that extends from one edge (element "E") of the target 24 through the center (element "C") point of the target 24 and out to the opposite edge (element "E") of the target 24.

FIG. 5B, also generally illustrates an "edge region", which is generally defined as an area of the target near the edge "E" of the target, and a "center region", which is generally defined as an area of the target that is positioned over the center "C" of the target. The edge and center regions are generally areas over which one or more magnetron regions are adapted to move to achieve the desired magnetic field strength profile across the target surface in the X and Y-directions. For example, as shown in FIGS. 5A and 5B the center magnetron region 301A is generally adapted to be moved across the center section and edge magnetrons 301B, 301C are generally adapted to be moved across their respective edge sections. In some cases overlap of each magnetron into adjacent regions may be desirable to assure desirable process results (e.g., improved target utilization). The size and shape of the edge and center regions may be adjusted to improve the deposition uniformity and may vary depending on the magnetic field strength, dwell time of the magnetron regions over each region, and other typical sputter process variables.

FIG. 5B illustrates an exemplary distribution of the magnetic field strength (elements 131A-B) across the target (see FIG. 5A) measured just below the target surfaces 24C in the processing region 15. As shown the magnetic field strength varies linearly from the edge of the target 24 and peaks at the center of the target 24. In this configuration the larger magnetic field strength in the center target 24 will tend to increase the plasma density in the center versus the edge of the target and thus can be used to improve the sputter deposition profile when used in large area substrate processing chambers. In one example, the magnetic field strength variation from the center of the target to the edge for a process chamber adapted to process a 2.2 m×2.5 m substrate is configured to deliver about 0 to about 500 gauss near the edge to about 300 to about 1000 gauss near the center of the target 24.

Referring to FIG. 5B, while the graph of magnetic field strength across the target 24 are shown to vary in a linear fashion from the center to the edge of the target, other embodiments of the invention may use second degree (e.g., quadratic), third degree (e.g., cubic), exponential, or other shaped curves that deliver a desired plasma density across the target face and desired sputter deposition profile without deviating from the basic scope of the invention described herein. Also, while FIG. 5B illustrates the magnetic field strength across the target 24, which peaks at the center ("C") of the target 24, this configuration is not intended to be limiting the basic scope of the invention. Furthermore, while FIG. 5B illustrates a magnetic field strength plot that varies in two main target sections (e.g., center and edge), other configurations may be used that contain an optimized magnetic field strength profile that contains multiple regions of changing magnetic field strength without varying from the basic scope of the invention as described herein.

In one embodiment, the magnets (not shown) in the magnetron regions (elements 301A-C) are electromagnets that may be translated or remain stationary over the target section(s) during processing. In one aspect, the magnetic field (B-Field) generated by the electromagnets can be dynamically adjusted during different phases of the deposition process, by adjusting the current passing through the plurality conductive coils contained in the electromagnet. In another aspect, the magnetic field generated by the electromagnets (element 27) can be dynamically adjusted as a function of position of the magnetron region 301 over its target 24. For example, the magnetron assembly's magnetic field strength may be reduced as magnetron region 301 is translated to positions that are near an edge of a target 24 (element "E") to reduce the interaction between the adjacent magnetron regions or other chamber components. The ability to adjust the magnetic field strength as a function of translational position can help to improve the deposition uniformity and reduce the interaction between the various target sections.

To perform a PVD deposition process, the controller 101 commands the vacuum pumping system 44 to evacuate the processing chamber 10 to a predetermined pressure/vacuum so that the plasma processing chamber 10 can receive a substrate 12 from a system robot (not shown) mounted to a central transfer chamber (not shown) which is also under vacuum. To transfer a substrate 12 to the processing chamber 10 the slit valve (element 46), which seals off the processing chamber 10 from the central transfer chamber, opens to allow the system robot to extend through the access port 32 in the chamber wall 41. The lift pins 74 then remove the substrate 12 from the extended system robot, by lifting the substrate from the extended robot blade (not shown). The system robot then retracts from the processing chamber 10 and the slit valve 46 closes to isolate the processing chamber 10 from the central transfer chamber. The substrate support 61 then lifts the substrate 12 from the lift pins 74 and moves the substrate 12 to a desired processing position below the target 24. The position of the magnetron assembly 23 may then be adjusted or continually varied as a function of time in the X, Y and/or Z directions to achieve a desired magnetic field in the processing region 15. Also, the shape of the flexible plate 505 may then be adjusted or continually varied as a function of time to achieve a desired magnetic field in the processing region 15. Then after achieving a desired base pressure, a desired flow of a processing gas is injected into the processing region 15 and a bias voltage is applied to the target 24 by use of a power supply 28 to generate a plasma in the processing region 15. The application of a DC bias voltage by the power supply 28 causes the gas ionized in the processing region 15 to bombard the target surface and thus "sputter" metal atoms that land on the processing surface 12A of the substrate positioned on the surface of the'substrate support 61.

Coordinated Motion

Figure 6:
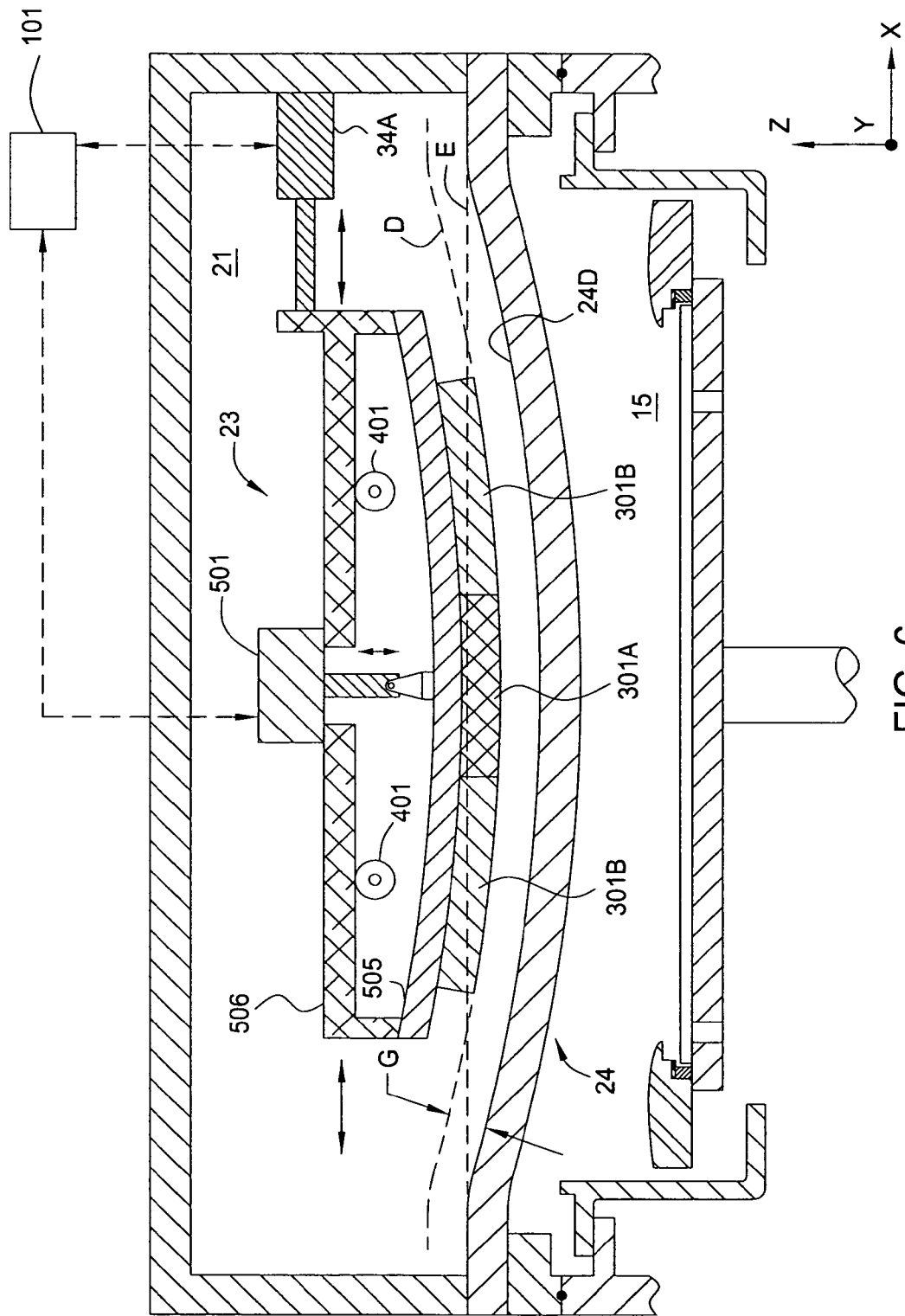
FIG. 6 is a vertical cross-sectional view of a processing region formed in an exemplary physical vapor deposition chamber.

Referring to FIGS. 4A and 6, in one embodiment, the shape of flexible plate 505 and/or the position of a magnetron assembly 23 in the Z-direction is adjusted relative to its position in the X-direction and/or Y-direction to account for the bow of the target 24, or to adjust the deposition uniformity. For example, referring to FIG. 5A, the position in the Z-direction of the magnetron region 301A may be vertically lower (i.e., closer to an un-bowed target 24) as the magnetron region is moved across the center "C" of the target versus when the magnetron region 301A is positioned a distance away from the center "C" of the target in the X or Y-directions.

FIG. 6 schematically illustrates a vertical cross-sectional view of processing chamber 10 that has a target 24 that is bowed and a magnetron assembly 23. The target 24, as noted above, may be bowed due to a pressure differential between the processing region 15 and the target backside region 21 and due to the distributed weight of the target, which thus causes the target to deflect relative to its original undeflected shape (element "E"). In this configuration the magnetron regions 301A-301C are supported and positioned in the Z-direction by use of a deflection actuator 501, a support plate 506 and one or more supporting rollers 401 that are adapted to carry the weight of the magnetron assembly 23 and allow motion in a desired direction (e.g., X-direction). To achieve a desired magnetic field strength in the processing region 15, and thus a desired deposition uniformity, it may be desirable to continuously control the shape of the flexible plate 505 and/or the position of the magnetron assembly 23 in the X, Y and Z-directions during processing. A typical method of monitoring and controlling the shape of the flexible plate 505 and the position and motion of the magnetron regions is to use a closed loop control scheme that utilizes encoders, or other similar devices, that are attached to each actuator (e.g., elements 34A and 501) and communicate with the controller 101. Therefore, in one embodiment, it is desirable to assure that a user-defined gap "G" (FIG. 6) is maintained between a magnetron region(s) (e.g., 301A) and the target backside surface 24D of a target 24 that has a bowed surface. The user-defined gap, for example, may be between about 0.5 mm and about 10 mm.

In one embodiment, it may be desirable to define one or more desired trajectory paths (element "D" in FIG. 6) which at least one of the magnetron regions follows as the magnetron assembly 23 is translated by use of the controller 101, the horizontal magnetron actuator(s) 34A, deflection actuator 501, and/or vertical magnetron actuator(s) 34B. In this configuration the controller 101 monitors and controls the position of one or more of the magnetron regions by coordinating and controlling the position of the magnetron regions by use of the horizontal magnetron actuator(s) 34A, deflection actuator 501, and vertical magnetron actuator(s) 34B. The trajectory path may be empirically defined, derived from modeling or calculated so that a desired deposition profile and/or deposition uniformity is achieved on the substrate surface. In one aspect, the trajectory path may be optimized to achieve a desired magnetic field strength in the processing region 15 and deposition profile on the surface of the processed substrate, and thus may not coincide with the bowed shape of the target 24.

While the foregoing is directed to embodiments of the present invention, other and further embodiments of the invention may be devised without departing from the basic scope thereof, and the scope thereof is determined by the claims that follow.

We claim:

1. A plasma processing chamber assembly for depositing a layer on a substrate comprising:
   a plasma processing chamber having a processing region;
   a target positioned in the plasma processing chamber so that a first surface of the target forms a wall of the processing region;
   a magnetron assembly positioned facing a second surface, opposite the first surface of the target, wherein the magnetron assembly comprises:
      a flexible plate spaced away from the target;
      a magnetron region positioned on the flexible plate, wherein the magnetron region has one or more magnets magnetically coupled to the processing region through the target; and
      a first actuator operably connected to one or more of the magnets to change the shape of the flexible plate and the magnetic field strength in the processing region; and
   a substrate support positioned inside the plasma processing region, wherein the substrate support is adapted to support a substrate on a substrate supporting surface.

2. The plasma processing chamber assembly of claim 1, wherein the substrate support is adapted to support a substrate that has a processing surface that has a surface area of at least 19,500 cm$^2$.

3. The plasma processing chamber assembly of claim 1, further comprising a second actuator that is operably connected to one or more of the magnets to change the shape of the flexible plate and the magnetic field strength in the processing region.

4. The plasma processing chamber assembly of claim 1, wherein the magnetron region has a first pole and a second pole that is magnetically coupled to the processing region through the target, wherein the first pole and the second pole are adapted to form a plasma loop that has a serpentine shape.

5. The plasma processing chamber assembly of claim 1, wherein the magnetron region has a first pole and a second pole that is magnetically coupled to the processing region through the target, wherein the first pole and the second pole are adapted to form a plasma loop that has a spiral shape.

6. The plasma processing chamber assembly of claim 1, wherein the magnetron assembly further comprises a second actuator that is adapted to supply a second force that causes the shape of the flexible plate and the magnetic field strength in the processing region to change.

7. The plasma processing chamber assembly of claim 1, further comprising a second actuator that is adapted to position the magnetron assembly in a direction generally perpendicular to a portion of the surface of the target.

8. A plasma processing chamber assembly for depositing a layer on a substrate comprising:
   a plasma processing chamber having a processing region;
   a target positioned in the plasma processing chamber so that a surface of the target forms a wall of the processing region;
   a magnetron assembly positioned near the target, wherein the magnetron assembly comprises:
      a flexible plate spaced away from the target;
      a first magnetron region positioned on the flexible plate, wherein the first magnetron region has one or more magnets magnetically coupled to the processing region through the target;
      a second magnetron region positioned on the flexible plate, wherein the second magnetron region has one or more magnets magnetically coupled to the processing region through the target; and p2 a first actuator that is adapted to position the flexible plate in a direction generally perpendicular to the surface of the target; and
   a substrate support positioned inside the plasma processing region, wherein the substrate support is adapted to support a substrate on a substrate supporting surface.

9. The plasma processing chamber assembly of claim 8, wherein the substrate support is adapted to support a substrate that has a processing surface that has a surface area of at least 19,500 cm$^2$.

10. The plasma processing chamber assembly of claim 8, further comprising a second actuator that is adapted to supply a force that causes the shape of the flexible plate and the magnetic field strength in the processing region to change.

11. The plasma processing chamber assembly of claim 8, wherein the first magnetron region has a first pole and a second pole that is magnetically coupled to the processing region through the target, wherein the first pole and the second pole are adapted to form a plasma loop that has a serpentine shape.

12. The plasma processing chamber assembly of claim 8, wherein the first magnetron region has a first pole and a second pole that is magnetically coupled to the processing region through the target, wherein the first pole and the second pole are adapted to form a plasma loop that has a spiral shape.

13. The plasma processing chamber assembly of claim 8, wherein a second actuator is also adapted to position the magnetron assembly in a direction parallel to a portion of the surface of the target.

14. The plasma processing chamber assembly of claim 8, wherein the first magnetron region is positioned over a center region of the target and the second magnetron region is positioned over an edge region, wherein the magnetic field strength delivered by at least a portion of the first magnetron region to the processing region is greater than the magnetic field strength delivered by the second magnetron region to the processing region.

15. A plasma processing chamber having a processing region and comprising:
   a target in the plasma processing chamber having a first surface facing the processing region;
   a magnetron in the plasma processing chamber comprising an array of magnets mounted on a flexible plate that faces and is parallel to and is spaced away from an opposite surface of the target; and
   at least one actuator connected to the magnets and adapted to deflect the flexible plate to change the distance between one or more of the magnets and the target.

* * * * *

UNITED STATES PATENT AND TRADEMARK OFFICE
CERTIFICATE OF CORRECTION

| | | |
|---|---|---|
| PATENT NO. | : 7,628,899 B2 | |
| APPLICATION NO. | : 11/301849 | |
| DATED | : December 8, 2009 | |
| INVENTOR(S) | : White et al. | |

It is certified that error appears in the above-identified patent and that said Letters Patent is hereby corrected as shown below:

Column 6, Line 60, please delete "o-ring'" and insert --o-ring-- therefor;

Column 16, Line 7, please delete "the'" and insert --the-- therefor;

Column 18, Claim 8, Line 11, please delete "p2".

Signed and Sealed this

Fourteenth Day of September, 2010

David J. Kappos
*Director of the United States Patent and Trademark Office*